(12) United States Patent
Diaconu et al.

(10) Patent No.: US 10,120,042 B2
(45) Date of Patent: Nov. 6, 2018

(54) MAGNETIC FIELD SENSOR AND RELATED TECHNIQUES THAT INJECT A SYNTHESIZED ERROR CORRECTION SIGNAL INTO A SIGNAL CHANNEL TO RESULT IN REDUCED ERROR

(71) Applicant: Allegro Microsystems, LLC, Worcester, MA (US)

(72) Inventors: Aurelian Diaconu, Londonderry, NH (US); Ryan Metivier, Nashua, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 1021 days.

(21) Appl. No.: 14/138,840

(22) Filed: Dec. 23, 2013

(65) Prior Publication Data
US 2015/0176963 A1 Jun. 25, 2015

(51) Int. Cl.
*G01R 33/07* (2006.01)
*G01D 5/14* (2006.01)

(52) U.S. Cl.
CPC ........... *G01R 33/077* (2013.01); *G01D 5/145* (2013.01)

(58) Field of Classification Search
CPC .. G01R 33/07; G01R 33/0029; G01R 33/077; G05B 19/0423; G01P 3/489; F21K 9/135; H02K 11/33; G01B 7/023; G01B 21/22; G01D 5/145
USPC ............ 324/207.2, 163, 207.12; 702/79, 151
See application file for complete search history.

(56) References Cited

U.S. PATENT DOCUMENTS

| | | |
|---|---|---|
| 4,327,416 A | 4/1982 | Jerrim |
| 4,668,914 A | 5/1987 | Kersten et al. |
| 4,725,957 A | 2/1988 | Alberter et al. |
| 4,761,569 A | 8/1988 | Higgs |
| 4,829,352 A | 5/1989 | Popovic et al. |
| 5,331,218 A | 7/1994 | Moody et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |

(Continued)

FOREIGN PATENT DOCUMENTS

| | | |
|---|---|---|
| DE | 10 2005 014 509 B4 | 10/2006 |
| DE | 10 2005 024 879 A1 | 12/2006 |

(Continued)

OTHER PUBLICATIONS

Office Acton dated Jun. 15, 2016; for U.S. Appl. No. 14/138,851; 51 pages.

(Continued)

*Primary Examiner* — Regis Betsch
*Assistant Examiner* — Kaleria Knox
(74) *Attorney, Agent, or Firm* — Daly, Crowley, Mofford & Durkee, LLP

(57) ABSTRACT

A magnetic field sensor has an error correction signal generator circuit to inject an error correction signal into a primary signal channel to cancel an error signal component in the primary signal channel.

27 Claims, 14 Drawing Sheets

(56) References Cited

U.S. PATENT DOCUMENTS

| | | |
|---|---|---|
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |
| 6,236,199 B1 | 5/2001 | Irle et al. |
| 6,265,864 B1 | 7/2001 | De Winter et al. |
| 6,288,533 B1 | 9/2001 | Haeberli et al. |
| 6,297,627 B1 | 10/2001 | Towne et al. |
| 6,356,741 B1 | 3/2002 | Bilotti et al. |
| 6,374,190 B2 | 4/2002 | Schupfner |
| 6,496,784 B1 | 12/2002 | Dukart et al. |
| 6,525,531 B2 | 2/2003 | Forrest et al. |
| 6,542,068 B1 | 4/2003 | Drapp et al. |
| 6,545,462 B2 | 4/2003 | Schott et al. |
| 6,622,012 B2 | 9/2003 | Bilotti et al. |
| 6,686,733 B2 | 2/2004 | Muth |
| 6,768,301 B1 | 7/2004 | Hohe et al. |
| 6,969,988 B2 | 11/2005 | Kakuta et al. |
| 7,030,606 B2 | 4/2006 | Kato et al. |
| 7,038,448 B2 | 5/2006 | Schott et al. |
| 7,085,119 B2 | 8/2006 | Bilotti et al. |
| 7,119,538 B2 | 10/2006 | Blossfeld |
| 7,159,556 B2 | 1/2007 | Yoshihara |
| 7,235,968 B2 | 6/2007 | Popovic et al. |
| 7,259,556 B2 | 8/2007 | Popovic et al. |
| 7,307,824 B2 | 12/2007 | Bilotti et al. |
| 7,362,094 B2 | 4/2008 | Voisine et al. |
| 7,714,570 B2 | 5/2010 | Thomas et al. |
| 7,746,065 B2 | 6/2010 | Pastre et al. |
| 7,759,929 B2 | 7/2010 | Forsyth |
| 7,872,322 B2 | 1/2011 | Schott et al. |
| 7,911,203 B2 | 3/2011 | Thomas et al. |
| 7,965,076 B2 | 6/2011 | Schott |
| 7,990,209 B2 | 8/2011 | Romero |
| 7,994,774 B2 | 8/2011 | Thomas et al. |
| 8,350,563 B2 | 1/2013 | Haas et al. |
| 8,416,014 B2 | 4/2013 | Romero |
| 2003/0042894 A1 | 3/2003 | Waffenschmidt |
| 2003/0057941 A1 | 3/2003 | Collier-Hallman et al. |
| 2005/0248306 A1 | 11/2005 | Chen et al. |
| 2005/0278137 A1* | 12/2005 | Hammerschmidt ... G01B 21/22 702/151 |
| 2006/0011999 A1 | 1/2006 | Schott et al. |
| 2006/0290545 A1 | 12/2006 | Granig et al. |
| 2007/0029998 A1 | 2/2007 | Popovic et al. |
| 2007/0288187 A1 | 12/2007 | Finkler et al. |
| 2009/0121707 A1 | 5/2009 | Schott |
| 2009/0174395 A1 | 7/2009 | Thomas et al. |
| 2010/0030427 A1 | 2/2010 | Mitsuhara et al. |
| 2010/0156397 A1 | 6/2010 | Yabusaki et al. |
| 2010/0164491 A1 | 7/2010 | Kejik et al. |
| 2011/0043197 A1 | 2/2011 | Trontelj |
| 2011/0248708 A1 | 10/2011 | Thomas et al. |
| 2012/0086442 A1 | 4/2012 | Haas et al. |
| 2012/0095712 A1 | 4/2012 | Komasaki et al. |
| 2012/0158335 A1 | 6/2012 | Donovan et al. |
| 2012/0218018 A1 | 8/2012 | Petrie |
| 2012/0218081 A1 | 8/2012 | Blake et al. |
| 2012/0262155 A1* | 10/2012 | Donovan ............ G01R 33/0029 324/207.2 |
| 2013/0265037 A1* | 10/2013 | Friedrich ............... G01R 33/07 324/207.2 |
| 2013/0293220 A1 | 11/2013 | Metivier et al. |
| 2014/0225598 A1* | 8/2014 | Romero ................. G01B 7/023 324/207.12 |
| 2015/0022188 A1 | 1/2015 | Daubert et al. |

FOREIGN PATENT DOCUMENTS

| | | |
|---|---|---|
| DE | 102005024879 A1 | 12/2006 |
| DE | 10 2006 037 226 A1 | 2/2008 |
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/02721 | 1/1998 |
| WO | WO 1998/010302 | 3/1998 |
| WO | WO 1998/054547 | 12/1998 |
| WO | WO 2000/002266 | 1/2000 |
| WO | WO 2003/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO 2014/126670 | 8/2014 |

OTHER PUBLICATIONS

Notice of Allowance dated May 6, 2016; for U.S. Appl. No. 13/947,608; 9 pages.

International Preliminary Report on Patentability dated Feb. 4, 2016 for PCT Application No. PCT/US2014/043770; 11 pages.

Allegro Microsystems, Inc.; "High Precision Linear Hall Effect Sensor IC with a Push/Pull, Pulse Width Modulated Output;" A1351; pp. 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik, et al.; "Ultra Low-Power Angular Position Sensor for High-Speed Portable Applications;" IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation: AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I²C Interface;" Aug. 14, 2008; 9 pages.

MEMSIC Corporation; MMC314xMS; "Ultra Small 3-axis Magnetic Sensor, with I²C Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

(56) References Cited

OTHER PUBLICATIONS

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datesheet; 10-Bit Programmable Magnetic Rotary Encoder;" Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; "Allegro Microsystems, Inc.; AN296081 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The $8^{th}$ International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The $8^{th}$ International Conference on Solid-State Sensors and Actuators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.
Van der Meer; et al; "CMOS quad spinning-current Hall-sensor system for compass application;" Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Drljaca, et al.; "Nonlinear Effects in Magnetic Angular Position Sensor With Integrated Flux Concentrator;" Proc. $23^{rd}$ International Conference on Microelectronics (MIEL 2002); vol. 1; NIS; Yugoslavia; May 12-15, 2002; pp. 223-226.
Petrie; "Circular Vertical Hall Magnetic Field Sensing Element and Method with a Plurality of Continuous Output Signals;" U.S. Appl. No. 13/035,243, filed Feb. 25, 2011; 56 pages.
Melexis MLX 90324; ""Under-the-Hood" Triaxis Rotary Position feat. SENT Protocol;" 3901090324 Data Sheet; Dec. 2008; 40 pages.
Response dated Nov. 19, 2015 to Office Action dated Jul. 20, 2015; for U.S. Appl. No. 13/766,327; 17 pages.
Notice of Allowance dated Dec. 24, 2015; for U.S. Appl. No. 13/766,327; 13 pages.
Request for Continued Examination dated Jan. 25, 2016; for U.S. Appl. No. 13/766,327; 3 pages.
Office Action dated Jan. 13, 2016; for U.S. Appl. No. 13/947,608; 36 pages.
PCT Search Report of the ISA for PCT/US2014/011580 dated Jun. 24, 2014 6 pages.
PCT Written Opinion of the ISA for PCT/US2014/011580 dated Jun. 24, 2014 7 pages.

(56) References Cited

OTHER PUBLICATIONS

PCT International Preliminary Report on Patentability and Written Opinion of the ISA dated Aug. 27, 2015; for Pat. App. No. PCT/US2014/011580; 9 pages.
European Patent Office Rule 161 dated Sep. 22, 2015; for European Pat. App. No. 14702173.7-1560; 2 pages.
Response to Office Action dated Mar. 4, 2016 for U.S. Appl. No. 13/947,608, 9 pages.
Banjevic; "High Bandwidth CMOS Magnetic Sensors Based on the Miniaturized Circular Vertical Hall Device;" Sep. 2011; 153 pages.
U.S. Appl. No. 13/766,327, filed Feb. 13, 2013, Romero et al.
U.S. Appl. No. 13/947,608, filed Jul. 22, 2013, Daubert et al.
U.S. Appl. No. 14/138,851, filed Dec. 23, 2013, Uberti et al.
Analog Devices; "AD639: Universal Trigonometric Function Converter;" http://www.analog.com/en/obsolete/ad639/products/product.html; Jun. 1985; 13 pages.
Intersil; "ICL8038 Precision Waveform Generator/Voltage controlled Oscillator;" http://www.intersil.com/en/products/other-analog/special-analog/other-miscellaneous/ICL8038.html; downloaded Jan. 16, 2014; 13 pages.
Schurig et al.: "CMOS Integrated Vertical Hall Sensor with Low Offset;" XVI The 16$^{th}$ European Conference on Solid State Transducers; Sep. 15-18, 2002; 4 pages.
Office Action dated Jul. 20, 2015; for U.S. Appl. No. 13/766,327; 52 pages.
International Search Report and Written Opinion dated Sep. 8, 2014 for PCT Application No. PCT/US2014/043770; 14 pages.
Notice of Allowance dated Oct. 17, 2016 for U.S. Appl. No. 14/138,851; 6 pages.
Response to Written Opinion filed Aug. 5, 2016 for European Application No. 14815202.8; 15 pages.
PCT International Preliminary Report of Patentability dated Jul. 7, 2016; for PCT Pat. App. No. PCT/US2014/069729; 15 pages.
AA Thornton Letter dated Feb. 1, 2017 regarding amended claims for EP Pat. Appl. No. 14815202.8; 3 pages.
Amended Claims regarding AA Thornton Letter dated Feb. 1, 2017 for EP Pat. Appl. No. 14815202.8; 6 pages.
Letter from Japanese Foreign Associate dated Nov. 4, 2016 and Voluntary Amendment w/ English translation of Claims not on File; for Japanese Patent Application No. 2015-558010; 16 pages.
Notice of Allowance dated Mar. 11, 2016; for U.S. Appl. No. 13/766,327; 11 pages.
Intention to Grant with allowed specification dated Dec. 9, 2016 for European Application No. 14738710.4; 60 pages.
PCT Search Report and Written Opinion of ISA; for PCT Pat. App. No. PCT/US2014/069729; dated Feb. 18, 2015; 19 pages.
Allowance Report dated Dec. 7, 2017 for JP Pat. Appl. No. 2015-558010; 1 page.
Allowance Claims dated Dec. 7, 2017 for JP Pat. Appl. No. 2015-558010; 8 pages.
English Translation of Japanese Office Action dated Sep. 7, 2017 for JP Pat. Appl. No. 2015-558010; 23 pages.
Claims now on file filed with the Japanese Patent Office on Oct. 25, 2016 for JP Pat. Appl. No. 2015-558010; 8 pages.
Response dated Apr. 4, 2016 to Official Communication dated Sep. 22, 2015; for European Pat. App. No. 14702173.7; 3 pages.
Amended Specification and Claims dated Apr. 4, 2016; for European Pat. App. No. 14702173.7; 13 pages.

\* cited by examiner

MAGNETIC FIELD SENSOR AND RELATED TECHNIQUES THAT INJECT A SYNTHESIZED ERROR CORRECTION SIGNAL INTO A SIGNAL CHANNEL TO RESULT IN REDUCED ERROR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that can provide an output signal representative of an angle of rotation of a target object, for which angular errors are reduced.

BACKGROUND OF THE INVENTION

Magnetic field sensing elements can be used in a variety of applications. In one application, a magnetic field sensing element can be used to detect a direction of a magnetic field, e.g., an angle of the direction of the magnetic field.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant and diffusion region in a substrate. The common implant and diffusion region can be a common epi (epitaxial) region (e.g., layer) upon a substrate, bounded by semiconductor isolation structures. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, an angle sensor. For example, an angle sensor can be provided from a plurality of separate vertical Hall elements or a plurality of magnetoresistance elements. Collectively, magnetic field sensing element(s) that generate an output signal related to an angle of a magnetic field are referred to herein "angle sensing elements."

More parameters can characterize the performance of and angle sensing element(s), e.g., CVH sensing element. One such parameter is an angular accuracy of the output signal generated by the angle sensing element(s). Angular accuracy can have both an average angle error (also referred to as an angle offset error or and angular offset) that is the same at all magnetic field pointing angles, and also an angle error that is different at different magnetic field angles (i.e., a non-linearity error). Another parameter is the speed with which the angle sensing element(s) can convey the angle of the magnetic field. It will be understood that the speed is particularly important for applications in which the angle of the magnetic field may be rapidly changing.

It is know that some parameters that can characterize an angle sensing element tend to change with temperature.

It would be desirable to provide circuits and techniques used in a magnetic field sensor that can remove error signal components in a signal channel to provide an output signal that has a high degree of accuracy and a relatively high speed.

SUMMARY OF THE INVENTION

The present invention provides circuits and techniques used in a magnetic field sensor that can remove error signal components in a signal channel to provide an output signal that has a high degree of accuracy and a relatively high speed.

In accordance with one aspect, a magnetic field sensor includes a plurality of magnetic field sensing elements configured to generate a respective plurality of x-y output signals. Each one of the x-y output signals is responsive to a magnetic field in an x-y plane. The magnetic field sensor also includes a sequence switches circuit coupled to receive the plurality of x-y output signals and configured to generate a sequential signal comprised of sequential ones of the plurality of x-y output signals. The sequential signal comprises a time waveform comprising an error component. The magnetic field sensor also includes an angle processing channel coupled to receive the sequential signal. The angle processing channel includes an angle processing channel output node. The angle processing channel also includes an electronic filter having an input node and an output node. The electronic filter is configured to generate a filtered signal at the output node of the electronic filter. The angle processing channel also includes a summing circuit having first and second input nodes and an output node. The first input node of the summing circuit is either coupled to receive a signal representative of the sequential signal or coupled to the output node of the electronic filter. The output node of the summing circuit is either coupled to the input node of the electronic filter or coupled to the angle processing channel output node. The magnetic field sensor also includes an error correction signal generator circuit having an output node, the error correction signal generator circuit for generating an error correction signal at the output node. The output node of the error correction signal generator circuit is coupled to the second input node of the summing circuit. The summing circuit is configured to generate a signal at the output node of the summing circuit with a corrected error component smaller than the error component of the sequential signal. The magnetic field sensor also includes a sine look up table memory coupled to the error correction processor and configured to store a plurality of sine values, wherein the error correction signal is generated in accordance with selected ones of the sine values.

In accordance with another aspect, a method of reducing an error in a magnetic field sensor includes providing a plurality of magnetic field sensing elements configured to generate a respective plurality of x-y output signals. Each one of the x-y output signals is responsive to a magnetic field in an x-y plane. The method also includes using the plurality of x-y output signals to generate a sequential signal comprised of sequential ones of the plurality of x-y output signals. The method also includes filtering a signal representative of the sequential signal to generate a filtered signal. The filtered signal comprises a time waveform comprising an error component. The method also includes generating an error correction signal. The method also includes summing the error correction signal with the filtered signal to generate a summed signal with a corrected error component smaller than the error component of the filtered signal. The method also includes storing a plurality of sine values, wherein the error correction signal is generated in accordance with selected ones of the sine values.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
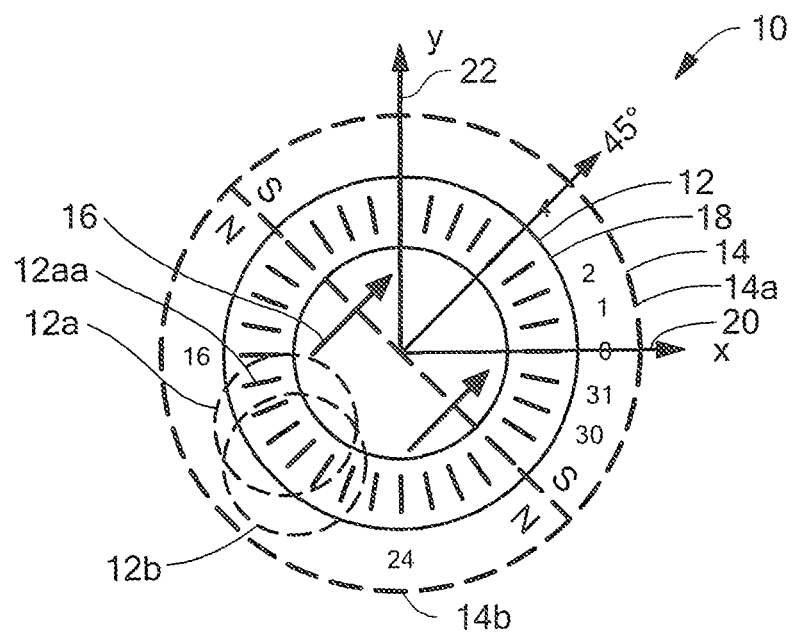
FIG. 1 is a pictorial showing a circular vertical Hall (CVH) sensing element having a plurality of vertical Hall elements arranged in a circle over a common implant and diffusion region upon a substrate, and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

While a circular vertical Hall (CVH) element, which has a plurality of vertical Hall elements, is described in examples below, it should be appreciated that the same or similar techniques and circuits apply to any type of magnetic field sensing element(s) arranged in a manner to detect an angle of a pointing direction of a magnetic field, i.e., a rotation angle of a target object to which a magnet is attached.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

Referring to FIG. 1, a circular vertical Hall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can be positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft or an automobile camshaft, and is subject to rotation relative to the CVH sensing element 12. With this arrangement, the CVH sensing element 12, in combination with electronic circuits described below, can generate a signal related to the angle of rotation of the magnet 14, i.e., an angle of rotation of the target object to which the magnet is coupled.

Figure 1A:
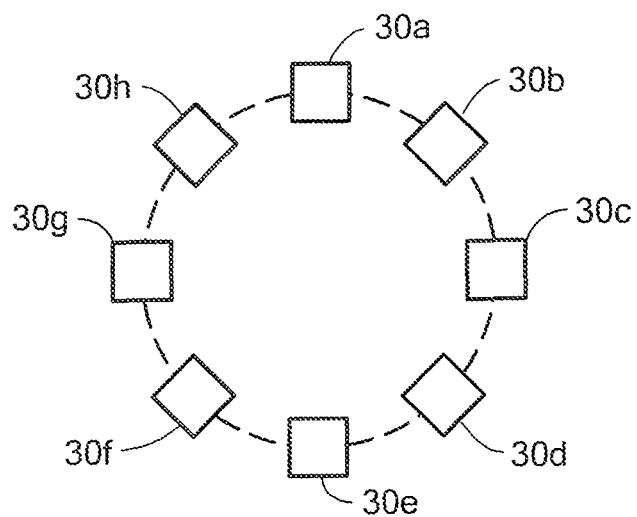
FIG. 1A is pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having a respective maximum response axis parallel to a surface of a substrate 34, each pointing in different rotational directions. These magnetic field sensing elements can be coupled to an electronic circuit the same as or similar to electronic circuits described below in conjunction with figures described below. There can also be a magnet the same as or similar to the magnet 14 of FIG. 1 disposed proximate to the magnetic field sensing elements 30a-30h.

Figure 2:
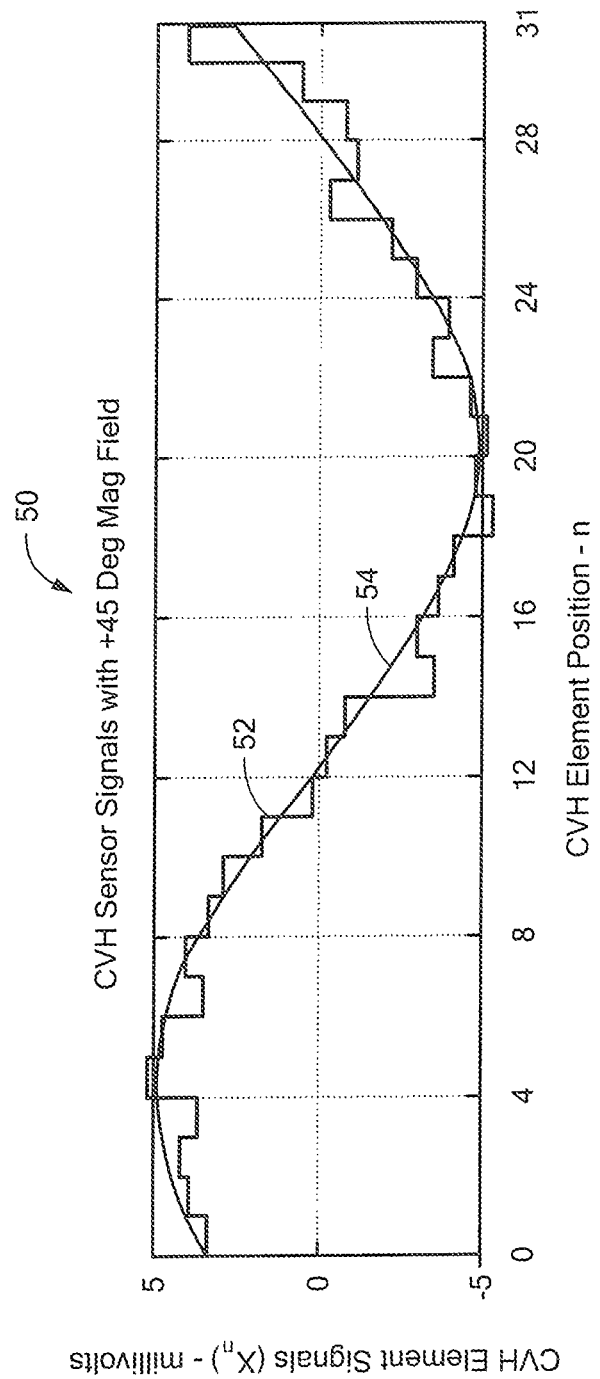
FIG. 2 is a graph showing an output signal as may be generated by the CVH sensing element of FIG. 1 or by the plurality of magnetic field sensing elements of FIG. 1A for a particular magnetic field pointing direction.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 pointing at positive forty-five degrees, a maximum positive signal is ideally achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is ideally achieved from a vertical Hall element centered at position 20, which is also aligned with the magnetic field 16 of FIG. 1, such that a line drawn between the vertical Hall element contacts (e.g., live contacts) of the vertical Hall element at position 20 is also perpendicular to the magnetic field.

A sine wave 54 is provided to more clearly show ideal behavior of the signal 52. The signal 52 has variations due to vertical Hall element DC offsets (or simply offsets) and sensitivities, which tend to cause corresponding variations of output signals causing them to be too high or too low relative to the sine wave 54, in accordance with errors for each element. The signal errors are undesirable.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 52 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 52 when current spinning is not used. However, for embodiments in which current spinning is used, each step of the signal 52 can be comprised of several sub-steps (not shown, e.g., four sub-steps), each sub-step indicative of a current spinning "phase."

It will be understood that a phase of the signal 52 is related to an angle of the magnetic field 16 of FIG. 1 relative to position zero of the CVH sensing element 12. It will also be understood that a peak amplitude of the signal 52 is generally representative of a strength of the magnetic field 16. Using electronic circuit techniques described above in PCT Patent Application No. PCT/EP2008/056517, or using other techniques described below, a phase of the signal 52 (e.g., a phase of the signal 54) can be found and can be used to identify the pointing direction of the magnetic field 16 of FIG. 1 relative to the CVH sensing element 12.

As shown, the various steps of the signal 52 can be irregular and not exactly follow the ideal sine wave 54. The signal 52 can have a frequency component at a fundamental frequency (i.e., a frequency of the sine wave 54). Due to the irregular steps of the signal 52, the frequency component at the fundamental frequency can include a desired component (i.e., signal vector) having the phase of the sine wave 54, and also an error component (i.e., error vector) at the same fundamental frequency. The desired component and the error component add together to result in an error in a phase of a filtered version of the signal 52, and therefore, an error in a computed pointing direction of the magnetic field 16 of FIG. 1. The computing is described more fully below in conjunction with FIGS. 3 and 4, and the error is more fully described below in conjunction with FIG. 5.

Also due to the irregular steps of the signal 52, the signal 52 can also have frequency components at one or more harmonics of the fundamental frequency. The harmonic components can also result in an error in the phase of a filtered version of the signal 52.

Figure 3:
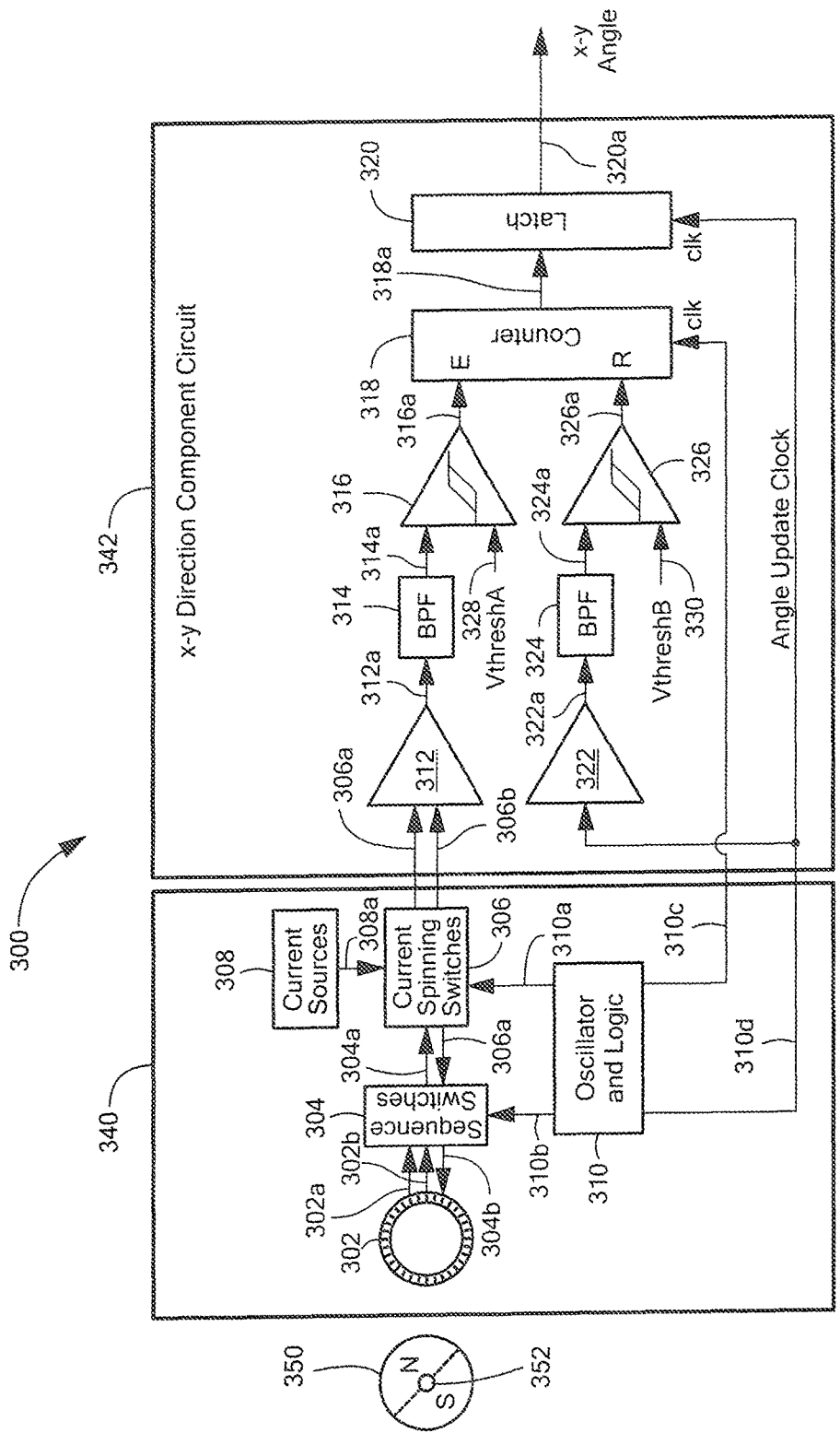
FIG. 3 is a block diagram showing a prior art electronic circuit that can be used with a CVH sensing element to generate an x-y output signal, the electronic circuit using analog signals in two signal channels.

Referring now to FIG. 3, an exemplary magnetic field sensor 300 can include a sensing circuit 340 having a CVH sensing element 302 having a plurality of vertical. Hall elements, each vertical Hall element comprising a group of vertical Hall element contacts (e.g., five vertical Hall element contacts). In some alternate embodiments, the CVH sensing element 302 is replaced by a group of magnetic field sensing elements described in conjunction with FIG. 1A.

A magnet 350 can be disposed proximate to the CVH sensing element 302, and can be coupled to a target object, e.g., a shaft 352 configured to rotate. The magnet 352 can be the same as or similar to the magnet 14 of FIG. 1

A sequence switches circuit 304 can be coupled to the CVH sensing element 302 to sequentially select ones of the vertical Hall elements within the CVH sensing element 302 to generate a sequential signal 304a, which can be the same as or similar to the signal 52 of FIG. 3, comprised of sequential output signals from the selected ones of the vertical Hall elements.

Chopping, or current spinning, will be understood to be an arrangement in which a group of vertical Hall element contacts, for example, five vertical Hall element contacts that form one vertical Hall element, are driven with current sources in a plurality of connection configurations, and signals are received from the group of vertical Hall element contacts in corresponding configurations. Thus, in accordance with each vertical Hall element position, n, there can be a plurality of sequential output signals during the chopping, and then the group increments to a new group, for example, by an increment of one vertical Hall element contact.

To this end, one or more current sources 308 are coupled to provide a current signal 308b to the current spinning switches, which couple the current signal to each selected one of the vertical Hall elements in a plurality of different ways sequentially. The current spinning switches generate a differential signal 306a, 306b, also representative of the signal 52 of FIG. 3, but with the above-described sub-steps (not shown).

An oscillator and logic circuit 310 generates clocking control signal 310a, 310b to cause the current spinning switches 306 and the sequence switches 304 to sequence and current spin in the above described way. The oscillator and logic circuit 310 also generates a clock 310b and a dock 310c.

The CVH differential output signal 308a, 308b is comprised of sequential output signals taken one-at-a-time around the CVH sensing element 302, wherein each sequential output signal is generated on a separate signal path and switched by the sequence switching circuit 304 into the path of the differential signal 308a, 308b. Therefore, the CVH differential output signal 308a, 308b can be represented as a switched set of CVH output signals $x_n = x_0$ to $x_{N-1}$, taken one at a time, where n is equal to a vertical Hall element position (i.e., a position of a group of vertical Hall element contacts that form a vertical Hall element) in the CVH sensing element 302, and where there are N such positions.

In one particular embodiment, the number of vertical Hall elements (each comprising a group of vertical Hall element contacts) in the CVH sensing element 302 is equal to the total number of sensing element positions, N. In other words, the CVH differential output signal 308a, 308b can be comprised of sequential output signals, wherein the CVH differential output signal 308a, 308b is associated with respective ones of the vertical Hall elements in the CVH sensing element 302 as the sequence switches circuit 304 steps around the vertical Hall elements of the CVH sensing element 302 by increments of one, and N equals the number of vertical Hall elements in the CVH sensing element 302. However, in other embodiments, the increments can be by greater than one vertical Hall element, in which case N is less than the number of vertical Hall elements in the CVH sensing element 302.

In one particular embodiment, the CVH sensing element 302 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 302, for example sixty-four vertical Hall elements. Also, the increments of vertical Hall element positions, n, can be greater than one vertical Hall element contact.

The magnetic field sensor 300 also includes an x-y direction component circuit 342. The x-y direction component circuit 342 can include an amplifier 312 coupled to receive the CVH differential output signal 306a, 306b. The amplifier 312 is configured to generate an amplified signal 312a. A bandpass filter 314 is coupled to receive the amplified signal 312a and configured to generate a filtered signal 314a. A comparator 316, with or without hysteresis, is configured to receive the filtered signal 314a. The comparator 316 is also coupled to receive a threshold signal 328. The comparator 316 is configured to generate a thresholded signal 316a generated by comparison of the filtered signal 314a with the threshold signal 328.

The x-y direction component circuit 342 also includes an amplifier 322 coupled to receive the clock signal 310d. The amplifier 322 is configured to generate an amplified signal 322a. A bandpass filter 324 is coupled to receive the amplified signal 322a and configured to generate a filtered signal 324a. A comparator 326, with or without hysteresis, is coupled to receive the filtered signal 324a. The comparator 326 is also coupled to receive a threshold signal 330. The comparator 326 is configured to generate a thresholded signal 326a by comparison of the filtered signal 324a with the threshold signal 330.

It should be understood that the amplifier 322, the bandpass filter 324, and a comparator 326 provide a delay of the clock signal 310d in order to match a delay of the circuit channel comprised of the amplifier 312, the bandpass filter 314, and the comparator 316. The matched delays provide phase matching, in particular, during temperature excursions of the magnetic field sensor 300.

A counter 318 can be coupled to receive the thresholded signal 316a at an enable input, to receive the clock signal 310c at a clock input, and to receive the thresholded signal 326a at a reset input.

The counter 318 is configured to generate a phase signal 318a having a count representative of a phase difference between the thresholded signal 316a and the thresholded signal 326a. The phase signal 318a is received by a latch 320 that is latched in accordance with the clock signal 310d. The latch 320 is configured to generate a latched signal 320a, also referred to herein as an "x-y angle signal."

It will be apparent that the latched signal 320a is a multi-bit digital signal that has a value representative of an angle of the magnetic field experience by the CVH sensing element 302, and thus, and angle of the magnet and target object.

In some embodiments, the clock signal 310b has a frequency of about 153,600 kHz (which is the sequence rate around the CVH sensing element 302), the clock signal 310a has a frequency of about 614,400 kHz (which is the current spinning sequence rate), the clock signal 310c has a frequency of about 1.25 MHz, and the angle update clock signal 310d has a frequency of about 4.8 kHz. For this arrangement, the sine wave signal 54 of FIG. 2 also has a fundamental frequency component at about 4.8 kHz. However in other embodiments, the frequencies can be higher or lower than these frequencies.

In some alternate embodiments, the amplifier 322, the bandpass filter 324, and the comparator 326 can be eliminated, resulting in one signal channel rather than two, and the clock signal 310d can instead be received at the reset input of the counter 318. In still other embodiments, the counter 318 and the latch 320 are replaced by an angle calculation processor configured to generate the x-y angle signal 320a.

Figure 4:
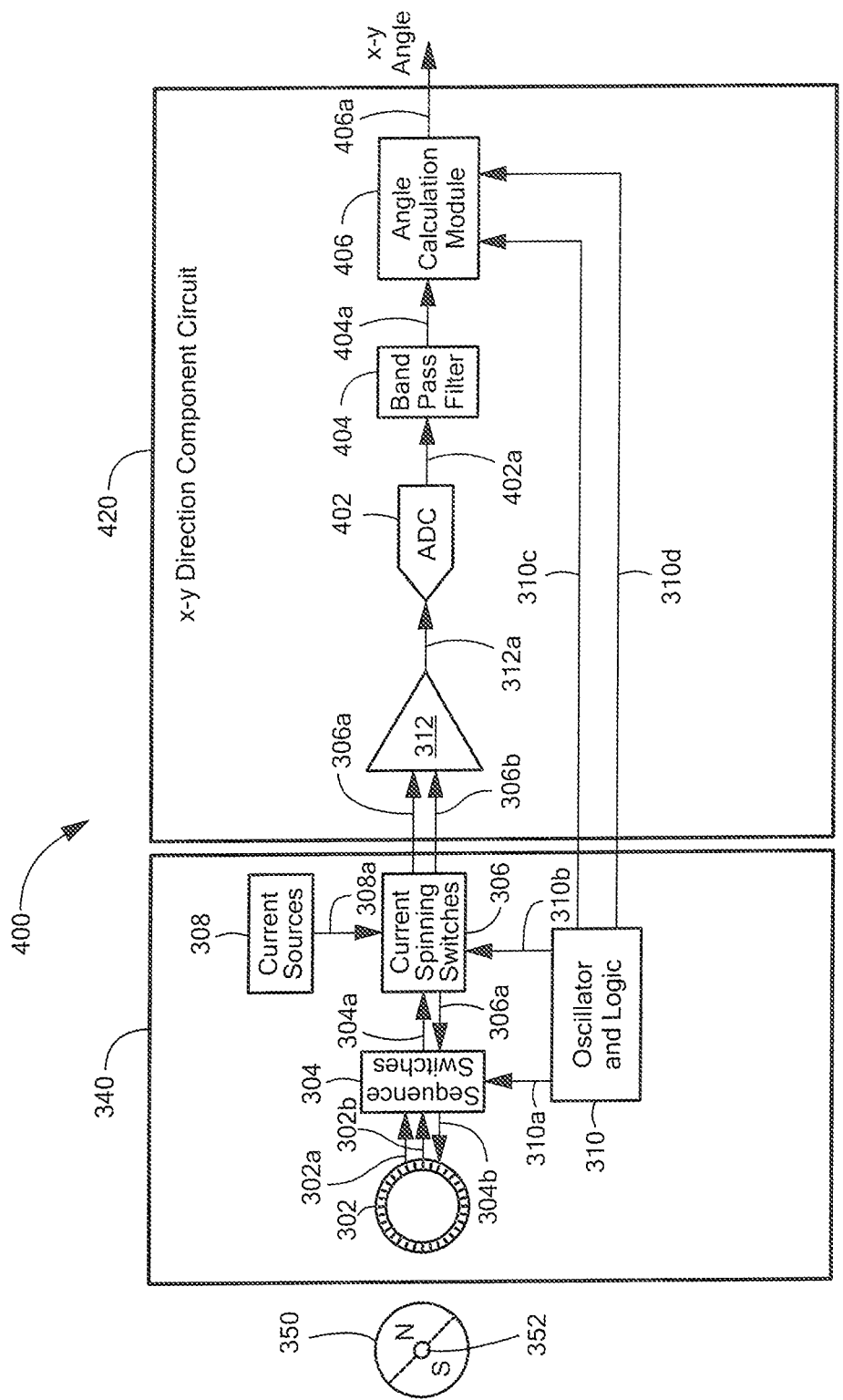
FIG. 4 is a block diagram showing another prior art electronic circuit that can be used with a CVH sensing element to generate an x-y output signal, the electronic circuit using digital signals in one signal channel.

Referring now to FIG. 4, in which like elements of FIG. 3 are shown having like reference designations, another exemplary magnetic field sensor 400 can include the sensing circuit 340 of FIG. 3.

The magnetic field sensor 400 can include an x-y direction component circuit 420 having the amplifier 312 of FIG. 3. The x-y direction component circuit 420 can also include an analog to digital converter (ADC) 402 coupled to receive the amplified signal 312a and configured to generate a converted signal 402a, a digital signal.

A digital band pass filter 404 can be coupled to receive the converted signal 402a and configured to generate a digital filtered signal 404a. An angle calculation module 406 can be coupled to receive the digital filtered signal 404a and configured to generate an x-y angle signal 406a representative of an angle of the magnetic field experienced by the CVH sensing element 302.

The angle calculation module 408 can also be coupled to receive the clock signals 310c, 310d.

The angle calculation module 408 is configured to compare a phase of the digital filtered signal 404a with phase of the clock signal 310d, which both have the same fundamental frequency.

As described above, the magnetic field sensor 300 of FIG. 3 has a second circuit channel so that any phase shift caused by the first circuit channel is also imparted upon the clock signal 310d that is used as a phase reference by the counter 318. Unlike the magnetic field sensor 300, the magnetic field sensor 400 has only one circuit channel. Any nominal phase difference between the clock signal 310d and the digital filtered signal 404a can be adjusted by the angle calculation module 406. Furthermore, because the one circuit channel uses mostly digital circuits, change of phase of the one circuit channel with temperature is fairly small. However, in other embodiments, the magnetic field sensor 400 can include, a second circuit channel like the magnetic field sensor 300 of FIG. 3, where the second circuit channel can be the same as or similar to the one circuit channel shown in the magnetic field sensor 400, but coupled to receive a clock signal. In still other arrangements, the magnetic field sensor 400 can include a temperature sensor (not shown) and compensation circuits (not shown) operable to compensate for any drill in phase with temperature.

Figure 5:
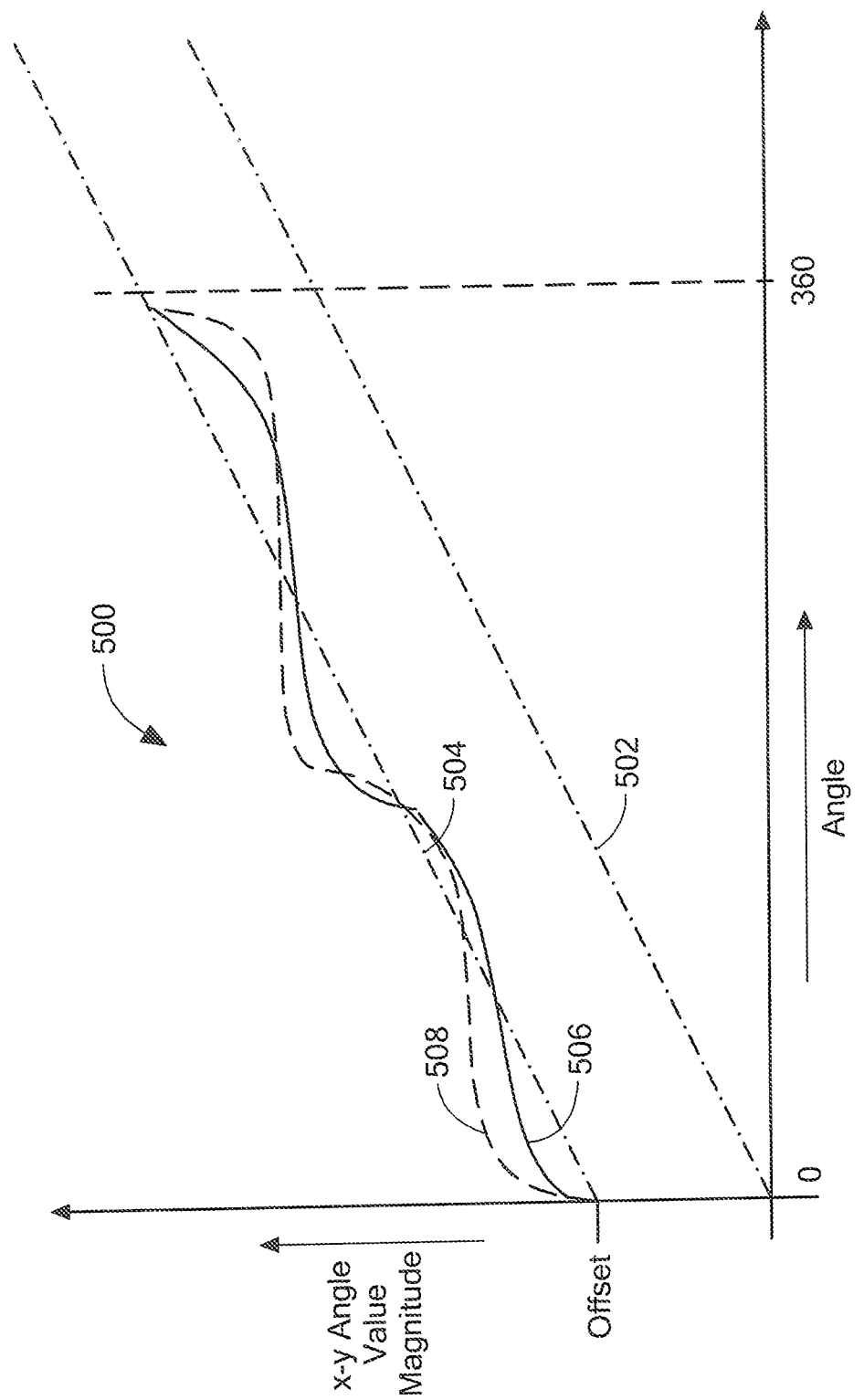
FIG. 5 is a graph showing ideal and non-ideal operation of the magnetic field sensors of FIGS. 3 and 4.

Referring now to FIG. 5, a graph 500 has a horizontal axis with a scale in units of angular degrees and a vertical axis with a scale in units of value of an x-y angle signal, for example, a value of the x-y angle signal 320a of FIG. 3, a digital signal.

A line 502 is representative of values of an x-y angle signal that have no angle error. When the values of the x-y angle signal have no angle error, the values of the x-y angle signal are perfectly linear with respect to actual angle, i.e., the values of the x-y angle signal are a perfect and true representation of the angle of the magnetic field generated by the magnet 350 of FIG. 3, and the line 502 passes through zero.

A line 504 is representative of values of the an x-y angle signal that has only an average (or DC) angle error, such that all angles represented by values of the x-y angle signal are offset by a fixed number of degrees. The line 504 does not pass through zero.

A curve 506 is representative of values of the x-y angle signal that have errors in representation of the true angle of the magnetic field generated by the magnet 350, average or DC errors and also an error that has a sinusoidal appearance.

A curve 508 is representative of values of the x-y angle signal that have other errors in representation of the true angle of the magnetic field generated by the magnet 350.

A variety of circuit characteristics of the magnetic field sensors 300, 400 of FIGS. 3 and 4 contribute to the errors, i.e., to both the DC (or average) angle error represented by the curves 506, 508, and to the sinusoidal shapes of the curves 506, 508. One factor that contributes to the errors versus angle is switching noise generated by the sequence switches 304 major by the current spinning switches 306 of FIGS. 3 and 4.

First, regarding the sequence switches 304, it will be understood that charge injection or switching spikes (together referred to as noise) generated by the sequence switches 304 are not necessarily exactly the same as each sequential vertical Hall element is selected in the CVH sensing element 302. When the noise generated by the sequence switches 304 is not the same as each vertical Hall element is selected, a DC (or average) angle error is generated and also a sinusoidal type error such as that represented by the curves 506, 508. The sinusoidal error characteristic can be, in part, a result of the noise generated by the sequence switches being repetitive for each cycle around the CVH sensing element 302, and thus, the noise will have an angle error frequency component at a frequency of the signal 52 of FIG. 2, and will add to the signal 52, i.e., to the differential signal 306a, 306b of FIGS. 3 and 4. The angle error frequency component is essentially fixed in phase, and therefore, the addition of the angle error to the differential signal 306a, 306b causes different phase shift errors in the summed signal depending on the phase of the differential signal 306a, 306b. Higher harmonics can also result from the noise.

Next, regarding the current spinning switches 306, it will be understood that charge injection or switching spikes (together referred to as noise) generated by the current spinning switches 306 are not necessarily exactly the same as each sequential vertical Hall element is selected in the CVH sensing element 302. When the noise generated by the current spinning switches 306 is not the same as each vertical Hall element is selected, a DC (or average) angle error is generated and also a sinusoidal type error such as that represented by the curves 506, 508. The sinusoidal error characteristic can, in part, result from the noise generated by the current spinning switches 306 being repetitive for each cycle around the (NH sensing element.

Other circuit characteristics can also contribute to the angle errors, i.e., to both the DC (or average) angle error represented by the error curves 506, 508, and to the sinusoidal shapes of the error curves 506, 508. Namely, a speed with which the amplifier 312 of FIGS. 3 and 4, and also other circuit elements of FIGS. 3 and 4, are able or unable to settle to final values as the sequence switches 304 switch among the vertical Hall elements of the CVH sensing element 302, and also as the current spinning switches 306 switch among the various current spinning phases, contribute to the errors.

The above-described circuit characteristics, including, but not limited to, switching noise and lack of circuit elements settling to final values, tend to be influenced by (i.e., changed by) a variety factors including, but not limited to, temperature of the magnetic field sensors 300, 400, rate of sequencing around the CVH sensing element 302, peak magnitude of the magnetic field experience by the CVH sensing element 302 as the magnet 350 rotates, and selected current spinning sequence(s) among the various vertical Hall elements.

Differences between the curves 506, 508 can be attributed to changes in the same factors, namely, changes in the temperature, changes in or differences in peak amplitude of the magnetic field experience by the CVH sensing element 302 as the magnet 350 rotates, changes in or differences in rates of sequencing around the CVH sensing element 302, and changes in or differences in selected current spinning sequence(s) among the various vertical Hall elements within the CVH sensing element 302. Among these factors, it will be understood that the changes in the temperature can occur at any time. The changes in the peak amplitude of the magnetic field can be influenced by positional changes, i.e., air gap changes, between the magnet 350 and the CVH sensing element 302. The changes in the peak amplitude of the magnetic field can also be influenced by mechanical considerations, for example, wear of a bearing or a shaft upon which the magnet 350 rotates. However, the changes in sequencing rates and the changes in current spinning sequences can be fixed, and changed only for different applications of the magnetic field sensors 300, 400.

In general, it has been determined that, due to operation of hand pass filters, e.g., band pass filters 316, 326, 404 of FIGS. 3 and 4, the dominant angle error frequency components occur at first and second harmonics of the frequency of the signal 52 (i.e., 306a, 306b). The curves 506, 508 are representative of angle error functions dominated by first and second harmonics of the frequency of the signal 52 (306a, 306b).

Circuits and techniques described below attempt to reduce the errors.

Mathematically, the angle error represented by the curves 506, 508 can be represented as:

$$\alpha_{err} = \text{OFF} + \text{DC}(T) + \sum_{n=1}^{\infty} H_{nA}(T) \cdot \sin(n\alpha + H_{nP}(T)) \quad (1)$$

where:
α=measured angle with error (see x-y angle signals 320a, 406a of FIGS. 3 and 4);
n=a variable indicative of an nth harmonic;

T=temperature of magnetic field sensor 300, 400;

OFF=a magnetic target positioning error, i.e., a mechanical misalignment of the CVH sensing element 302 in relation to the magnet 350 of FIGS. 3 and 4, which is usually independent of the temperature, T;

DC(T)=an average of DC angle error, which is a function of the temperature, T;

$H_{nA}$(T)=an amplitude of an nth-harmonic component of the error, which is a function of the temperature, T; and $H_{nP}$(T) a phase of the nth-harmonic component, which is a function of the temperature, T.

Other factors described above, other than temperature, which affect the angle error, are not taken into account in equation 1. Namely, the rate of sequencing around the CVH sensing element 302 is not taken into account, the peak amplitude of the magnetic field experienced by the CVH sensing element 302 and generated by the magnet 350 is not taken into account, and the current spinning phase sequence generated by the current spinning switches 308 is not taken into account in the above expression. Mechanical stresses upon the magnetic field sensor, which can also affect the angle error, are also not taken into account.

An estimated and quantized angle error (rather than non-quantized error of equation (1)) can be mathematically expressed as:

$$\alpha'_{err} = \text{OFF} + DC_q(T) + \sum_{n=1}^{\infty} H_{nA\_q}(T) \cdot \sin(n\alpha + H_{nP\_q}(T)) \quad (2)$$

where:

q stands for quantized values.

As temperature varies, each harmonic component of the angle error represented by equation (2) can change independently in amplitude and phase.

Figure 6:
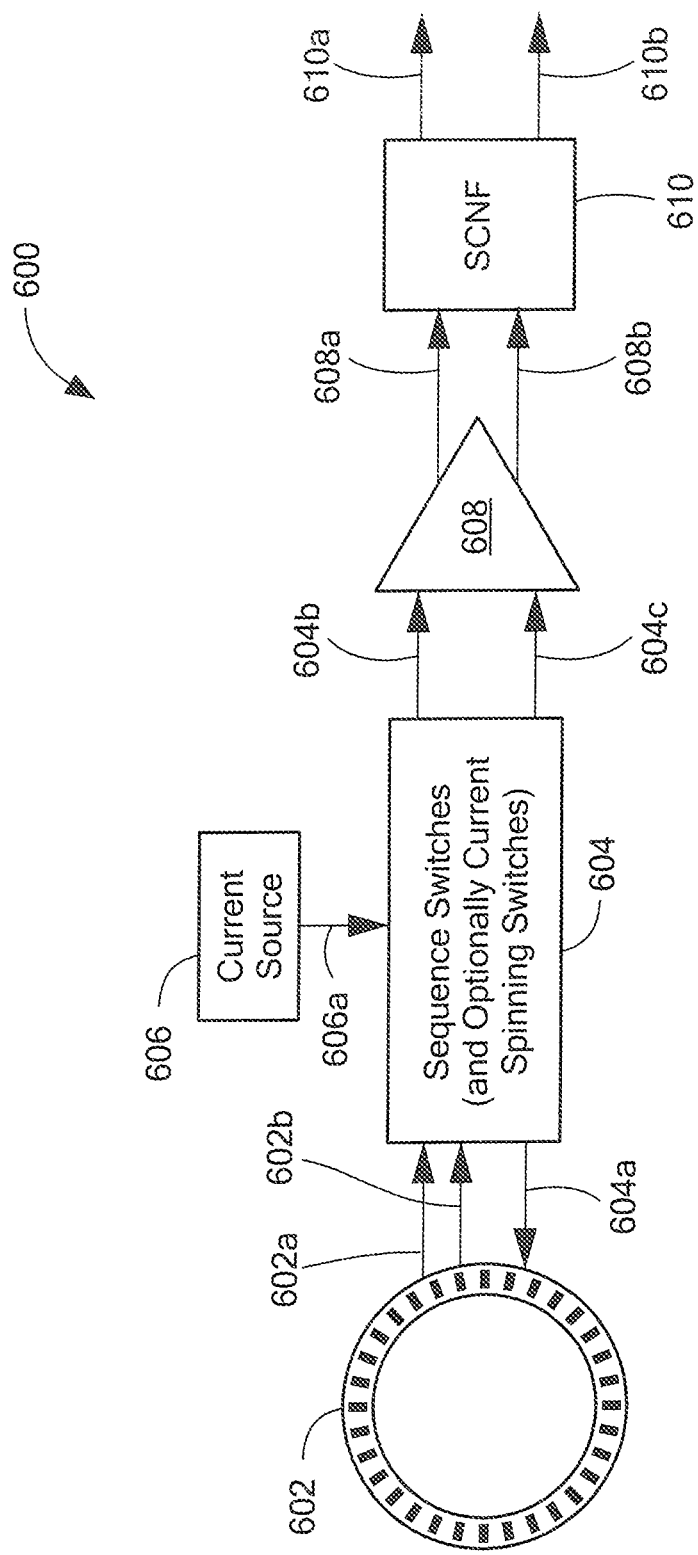
FIG. 6 is a block diagram of a circuit that can be used in conjunction with a CVH sensing element.

Referring to FIG. 6, a portion 600 of a magnetic field sensor includes a CVH sensing element 602. The CVH sensing element 602 is coupled to receive a current signal 606a at different selected ones of a plurality of contacts in accordance with a sequence through the vertical Hall elements of the CVH sensing element and in accordance with a plurality of current spinning phases determined by a sequence switches circuit 604 that can optionally include current spinning switches 604. A current source 606 supplies the current signal 606a.

An output signal of the CVH sensing element 602 is coupled to the switches 604 under control of a control signal 604a.

Specific couplings for two or four phase current spinning are well understood.

The sequence switches circuit 604 is configured to provide a differential output signal 604a, 604b to an amplifier 608. The amplifier 608 provides a differential amplified signal 606a, 606b to a filter 610 configured to provide a differential output signal 610a, 610b.

In some embodiments, the filter 610 is a switched capacitor notch filter that operates with analog samples of the amplified differential signal 608a, 608b. A switched capacitor notch filter is described in U.S. Pat. Nos. 5,331,218, 7,990,209, and 8,416,014, issued Jul. 19, 1994, Aug. 2, 2001, and Apr. 9, 2013, respectively, each of which is incorporated by reference herein in its entirety.

It will be understood that, in the frequency domain, as a result of a particular type of current spinning, referred to herein as an offset current spinning, the differential amplified signal 608a, 608b comprises two frequency components. A baseband signal component is responsive to a magnetic field and remains at baseband. However, an offset signal component within the differential signal 608a, 608c is shifted to a higher frequency according to a frequency at which the current spinning sequences through the phases, i.e., a chopping frequency.

In operation described more fully below, the filter 610 can remove the offset signal component of the differential signal 608a, 608b, leaving only the magnetically responsive signal component in the differential output signal 610a, 610b.

Figure 7:
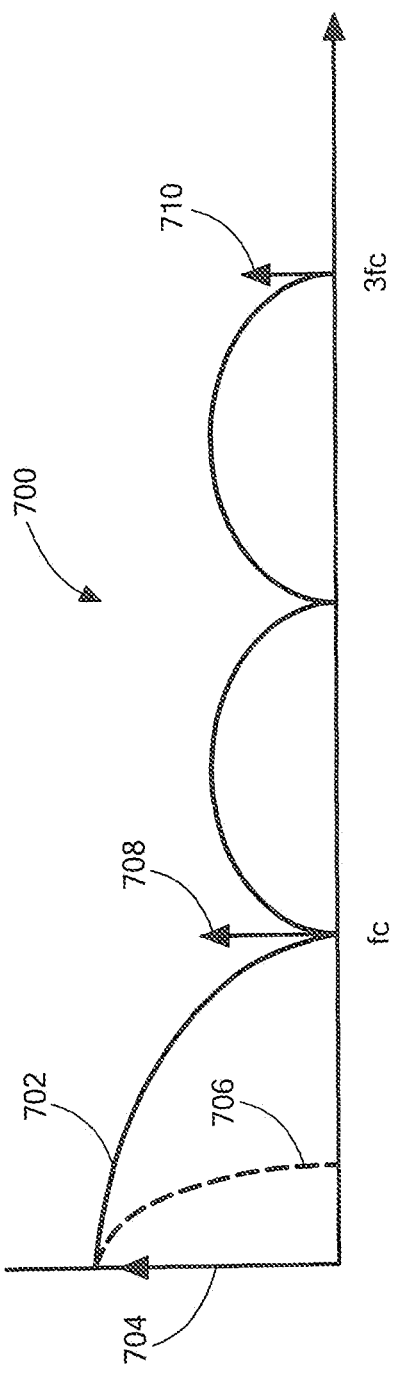
FIGS. 7 and 8 are graphs showing filtering operation of the circuit of FIG. 6.

Referring now to FIG. 7, a graph 700 has a horizontal axis with a scale in units of frequency in arbitrary units and a vertical axis with a scale in amplitude in arbitrary units.

The graph 700 is representative of operation of a magnetic field sensor like the magnetic field sensor 600 of FIG. 6.

A spectral line 704 is representative of the magnetically responsive baseband signal component of the differential signal 608a, 608b of FIG. 6. A spectral line 708 is representative of the offset signal component of the differential signal 608a. 608b of FIG. 6 after the current spinning operation of the current spinning switches 604. A spectral line 710 is representative of a third harmonic of the offset signal component represented by the spectral line 708. Other higher harmonics may also be present.

It will be understood that the spectral line 704 is representative of the CVH sensing element 602 being responsive to a. DC magnetic field. However, the CVH sensing element 602 can be responsive to AC magnetic fields. Thus, a baseband bandwidth 706 is representative of a region in which the magnetic field sensing element 602 can provide baseband signal information responsive to a magnetic field.

A transfer function 702 is representative of a transfer function of one of particular embodiment of the filter 610 of FIG. 6. In particular, the transfer function 702 is representative of a switched capacitor notch filter having transfer function notches. In some embodiments, it is advantageous to design the filter 610 such that the notches appear at the same positions as the offset signal component spectral lines 708, 710. Thus, with such a filter, the differential output signal 610a, 610h will have content only within the baseband 706.

It will be recognized that use of a filter tends to slow down operation of the magnetic field sensor 600. Also, because the passband 706 must roll off below the frequency fc, the operational bandwidth of the magnetic field sensor 600 tends to be restricted.

While a switched capacitor notch filter 610 is described above, it should be understood that the same frequency spectrum and the same behaviors can apply to a digital notch filter, and also to a continuous time filter, i.e. without notches, that has sufficient attenuation.

Figure 8:
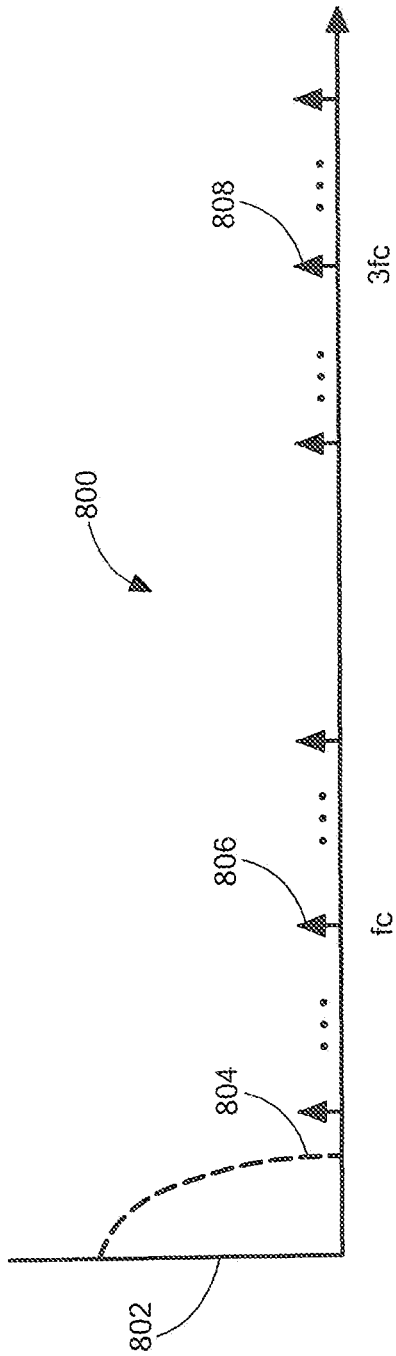

Referring now to FIG. 8, a graph 800 has a horizontal axis with a scale in units of frequency in arbitrary units and a vertical axis with a scale in amplitude in arbitrary units.

The graph 800 is representative of operation of a magnetic field sensor like the magnetic field sensor 600.

A spectral line 802 is representative of the magnetically responsive baseband signal component of the differential signal 608a, 608b. A spectral line 806 is representative of the offset signal component of the differential signal 610a, 610b after the filter 610. A spectral line 808 is representative of a third harmonic of the offset signal component represented by the spectral line 710, after the filter 610.

It will be understood that the spectral line 802 is representative of the CVH sensing element 602 being responsive to a DC magnetic field. However, the CVH sensing element 602 can be responsive to an AC magnetic field. Thus, a baseband signal bandwidth 804 is representative of a region in which the CVH sensing element 602 can provide signal information responsive to a magnetic field.

Other low amplitude spectral lines as shown may result from the variation of the current spinning phase sequences, depending upon the exact nature of the variation. There can be additional spectral lines that are not shown, but which are also at low amplitude.

It will be appreciated that the spectral lines 806, 808, and all other extraneous spectral lines, have a much lower amplitude than the spectral lines 708, 710 of FIG. 7.

Figure 9:
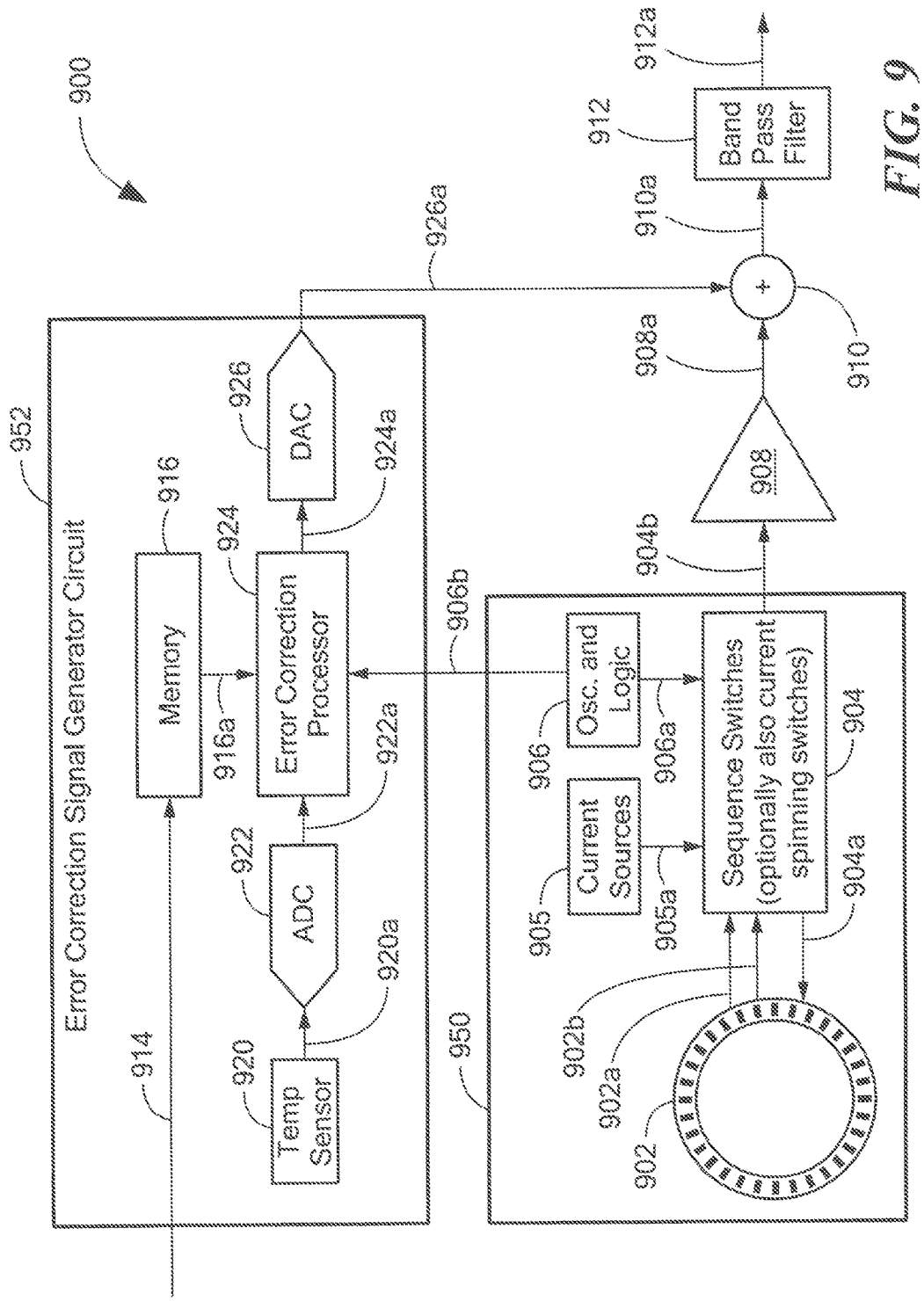
FIG. 9 is a block diagram showing a portion of an exemplary magnetic field sensor having an exemplary error correction signal generator circuit, the portion of the exemplary magnetic field sensor using analog signals in one signal channel.

Referring now to FIG. 9, a circuit portion 900 of an exemplary magnetic field sensor can include a sensing circuit 950 that can be the same as or similar to the sensing circuit 340 of FIGS. 3 and 4. The sensing circuit 950 can include a CVH sensing element 902 coupled to sequence switches 902 and optional current spinning switches 904. Oscillator and logic 906 can generate one or more clock and control signals 906a to control the sequence switches 902 and to control the optional current spinning switches if they are used. One or more current sources 905 can provide a respective one or more current signals 905a to sequentially drive vertical Hall elements within the CVH sensing element 902.

The sequence switches 904 can generate a sequential signal 904b of which the signal 52 of FIG. 2 is representative. An amplifier 908 can be coupled to receive the sequential signal 904b and configured to generate an amplified signal 908a, which is also a sequential signal. A summing node 910 can be coupled, at a first input node, to receive the amplified signal 908a and configured to generate a summed signal 910a at an output node.

A bandpass filter 912 can be coupled to receive the summed signal 910a and configured to generate a filtered signal 912a.

It should be understood that the sensing circuit 950, the amplifier 908, the summing node 910, and the bandpass filter 912 can be analog circuits. However, a digital arrangement is described below in conjunction with FIG. 10.

It will be understood from FIGS. 3 and 4, that, in some embodiments, the filtered signal 912a can be received by an angle calculation module (not shown), for example, the angle calculation module 406 of FIG. 4, in order to generate an x-y angle signal representative of an angle of a magnetic field sensed by the CVH sensing element 902 in an x-y plane.

The portion 900 of the magnetic field sensor can include an error correction signal generator circuit 952. The error correction signal generator circuit 952 is configured to generate an error correction signal 926a. The summing node 910 is coupled to receive the error correction signal 926a at a second input node.

From discussion above in conjunction with FIG. 5, it will be understood that the amplified signal 908a includes a variety of signal components, including, a desired baseband signal component at a fundamental frequency of the sequential signal 52 of FIG. 2, an error component at the fundamental frequency, and further error components at harmonics, e.g., a second harmonic, of the fundamental frequency. Without a correction, or removal, of the error components, at least the error component at the fundamental frequency, and some amount of error component at the second harmonic of the fundamental frequency, will appear in the filtered signal 912a. These error components can ultimately result in an error of the angle of the magnetic field reported by the x-y angle signal 320, 406 of FIGS. 3 and 4. In essence, the error correction signal 926a cancels error components that would otherwise pass through the bandpass filter 912.

The error correction signal generator circuit 952 can include a memory device 916, which, in some embodiments, can be in nonvolatile memory device, for example an EEPROM or a PROM, coupled to receive one or more error correction coefficients 914 from outside of the portion 900. The error correction coefficients are described more fully below.

The error correction signal generator circuit 952 can include an error correction processor 924. The error correction processor 924 can be coupled to receive selected error correction coefficients 916a and configured to generate a digital error correction signal 924a. A DAC (digital to analog converter) 926 can convert the digital error correction signal 924a into an analog error correction signal 926a.

In some embodiments, the error correction signal generator circuit 952 can include a temperature sensor 920 configured to generate a temperature signal 920a. An ADC (analog-to-digital converter) 922 can be coupled to receive the temperature signal 920a and configured to generate a digital temperature signal 922a received by the error correction processor 924. In some embodiments, the error correction processor 924 generates the error correction signal 926a in accordance with the selected error correction coefficients 916a. In other embodiments, the error correction processor 924 generates the error correction signal 926a in accordance with the temperature signal 920a and in accordance with the selected error correction coefficients 916a. In other words, in some embodiments, the error correction processor 924 can either modify the selected error correction coefficients 916a, or the error correction processor 924 can make the selection of the selected error correction coefficients 916a in accordance with the temperature signal 920a.

In view of the above, in some embodiments, the error correction signal generator circuit 952 generates the error correction signal 926a without regard to temperature. In other embodiments, the error correction signal generator circuit 952 generates the error correction signal 926a to account for changes that may occur in the error components of the amplified signal 908a as temperature changes.

In other embodiments, the CVH sensing element 902 can be replaced by a plurality of separate magnetic field sensing elements, such as those described above in conjunction with FIG. 1A.

Importantly, because the summing node 910 is connected here at the input of the bandpass filter 912, the error correction signal 926a can be simple in nature. The error correction signal 926a, an analog signal, can have very few analog states. For example, in one embodiment, the error correction signal 926a can have only two analog states, with a fundamental frequency at the fundamental frequency of the sequential signal 904b, amplitude and a phase of such an error correction signal 926a can be selected by way of the error correction coefficients 916a to cancel the fundamental frequency error component of the amplified signal 908a described above.

However, it will also be understood that an analog signal that has two analog states has spectral components not only at the fundamental frequency, but also at odd harmonics of the fundamental frequency, which harmonics would be undesirable. However, because the error correction signal 926a, as part of the summed signal 910a, passes through the bandpass filter 912, the higher harmonics are removed by operation of the bandpass filter 912.

In some another embodiments, the error correction signal 926a can have analog states representative of a sum of an analog square wave at the fundamental frequency and an analog square wave at the second harmonic of the fundamental frequency. Amplitudes and a phases of the fundamental an second harmonic components of the error correction signal 926a can be selected by way of the error correction coefficients 916a to cancel the above-described fundamental frequency error component and also to cancel the above-described second harmonic error component of the amplified signal 908a by way of the summing node 910a. The bandpass filter 912 can remove undesirable higher harmonic components of the error correction signal 926a, and thus, the error correction signal 926a can still have very few analog states.\

Exemplary error correction signals suitable for the error correction signal generator circuit 952 are described below in conjunction with FIG. 12.

Figure 10:
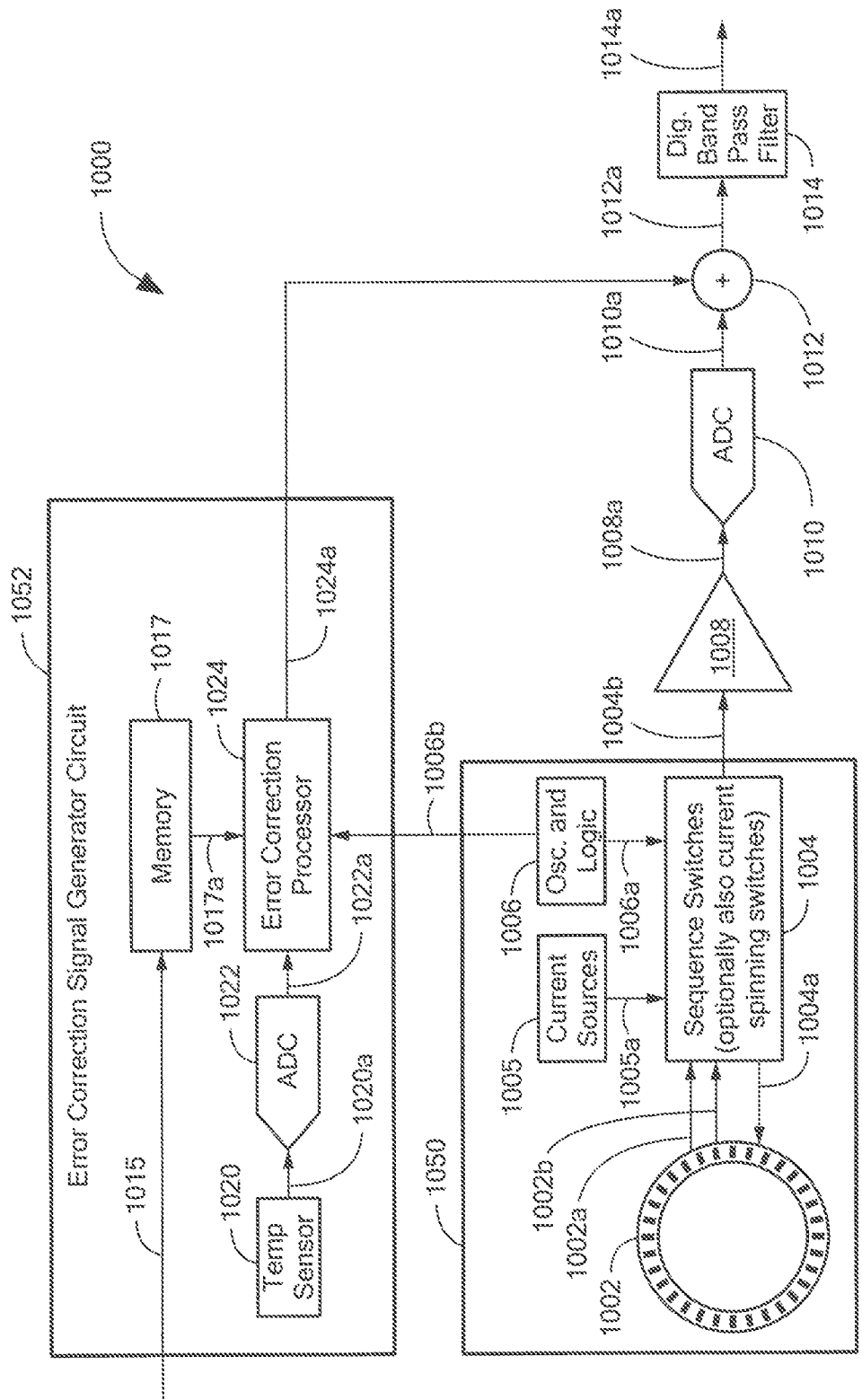
FIG. 10 is a block diagram showing a portion of another exemplary magnetic field sensor having another exemplary error correction signal generator circuit, the portion of the exemplary magnetic field sensor using digital signals in one signal channel.

Referring now to FIG. 10, a circuit portion 1000 of an exemplary magnetic field sensor can include a sensing circuit 1050 that can be the same as or similar to the sensing circuit 950 of FIG. 9. Thus, the sensing circuit 1050 can include a CVH sensing element 1002, sequence switches 1004 and optional current spinning switches 1004, an oscillator and logic circuit 1006, and one or more current sources 1005.

The sequence switches 1004 and optional current spinning switches 1004 are configured to generate a sequential signal 1004b, an analog signal, of which the signal 52 of FIG. 2 is representative. An amplifier 1008 is coupled to receive the sequential signal 1004b and configured to generate an amplified signal 1008a, also a sequential signal.

An ADC 1010 is coupled to receive the amplified signal 1008a and configured to generate a digital sequential signal 1010, comprised of sequential digital words, each representative of a respective one of the steps in the signal 52 of FIG. 2.

A digital summing node 1012 is coupled to receive the sequential digital signal 1010a at first input node. The summing node 1012 is configured to generate a summed signal 1012a at an output node. A digital bandpass filter 1014 is coupled to receive the summed signal 1012a and configured to generate a digital filtered signal 1014a.

It will be understood from FIGS. 3 and 4, that, in some embodiments, the digital filtered signal 1014a can be received by an angle calculation module (not shown), for example, the angle calculation module 406 of FIG. 4, in order to generate an x-y angle signal representative of an angle of a magnetic field sensed by the CVH sensing element 1002 in an x-y plane.

Like signals described above in conjunction with FIG. 9, it will be understood that the amplified signal 1008a and the digital sequential signal 1010a both include a variety of signal components, including a desired baseband signal component at a fundamental frequency of the sequential signal 52 of FIG. 2, an error component at the fundamental frequency, and further error components at harmonics, e.g., a second harmonic, of the fundamental frequency. The error components are discussed above and are not discussed again here.

An error correction signal generator circuit 1052 is configured to generate an error correction signal 1024a, here a digital signal, to cancel the error signal components by way of the summing node 1012. In essence, the error correction signal 1024a cancels error components that would otherwise pass through the bandpass filter 1014.

The error correction signal generator circuit 1052 can include a memory device 1017, which, in some embodiments, can be in nonvolatile memory device, for example an EEPROM or a PROM, coupled to receive one or more error correction coefficients 1015 from outside of the circuit portion 1000. The error correction coefficients are described more fully below.

The error correction signal generator circuit 1052 can include an error correction processor 1024. The error correction processor 1024 can be coupled to receive selected error correction coefficients 1017a and configured to generate a digital error correction signal 1024a.

In some embodiments, the error correction signal generator circuit 1052 can include a temperature sensor 1020 configured to generate a temperature signal 1020a. An ADC (analog-to-digital converter) 1022 can be coupled to receive the temperature signal 1020a and configured to generate a digital temperature signal 1022a received by the error correction processor 1024. In some embodiments, the error correction processor 1024 generates the error correction signal 1024a in accordance with the selected error correction coefficients 1016a. In other embodiments, the error correction processor 1024 generates the error correction signal 1024a in accordance with the temperature signal 1020a and in accordance with the selected error correction coefficients 1016a. In other words, in some embodiments, the error correction processor 1024 can either modify the selected error correction coefficients 1016a, or the error correction processor 1024 can make the selection of the selected error correction coefficients 1016a in accordance with the temperature signal 1020a.

In view of the above, in some embodiments, the error correction signal generator circuit 1052 generates the error correction signal 1024a without regard to temperature. In other embodiments, the error correction signal generator circuit 1052 generates the error correction signal 1024a to account for changes that may occur in the error components of the amplified signal 1008a as temperature changes.

In other embodiments, the CVH sensing element 1002 can be replaced by a plurality of separate magnetic field sensing elements, such as those described above in conjunction with FIG. 1A.

Importantly, because the summing node 1012 is connected here at the input of the digital bandpass filter 1014, the error correction signal 1024a can be simple in nature. For example, the error correction signal 1024a, a digital signal, can have very few digital states. For example, in one embodiment, the error correction signal 1024a can have only two digital states, with a fundamental frequency at the fundamental frequency of the sequential signal 904b. An amplitude and a phase of such an error correction signal 1024a can be selected by way of the error correction coefficients 1017a to cancel the fundamental frequency error component of the amplified signal 1008a described above.

However, it will be understood that a digital signal that has two digital states has spectral components not only at the fundamental frequency, but also at odd harmonics of the fundamental frequency, which harmonics would be undesirable. However, because the error correction signal 1024a, as part of the summed signal 1012a, passes through the digital bandpass filter 1014, the higher harmonics are removed by operation of the digital bandpass filter 1014.

In some another embodiments, the error correction signal 1024a can have digital states representative of a sum of a digital square wave at the fundamental frequency of the sequential signal 1014b and a digital square wave at the second harmonic of the fundamental frequency. Amplitudes and phases of the fundamental and second harmonic components of the error correction signal 1024a can be selected by way of the error correction coefficients 1017a to cancel the fundamental frequency error component and also to cancel the second harmonic error component of the sequential signal 1004b described above by way of the summing node 1012a. The bandpass filter 1014 can remove undesirable higher harmonic components of the error correction signal 1024a, and thus, the error correction signal 1024a can still have very few digital states.

Exemplary error correction signals suitable for the error correction signal generator circuit 1052 are described below in conjunction with FIG. 12.

It will be recognized that the circuit portions 900, 1000 of the magnetic field sensor described above in conjunction with FIGS. 9 and 10 are representative of one channel magnetic field sensors like the magnetic field sensor 400 of FIG. 4. Two channel arrangements like the two channel magnetic field sensor 300 of FIG. 3 are also possible. The circuit portion 900 uses continuous analog circuits and the portion 1000 uses continuous digital circuits.

Figure 11:
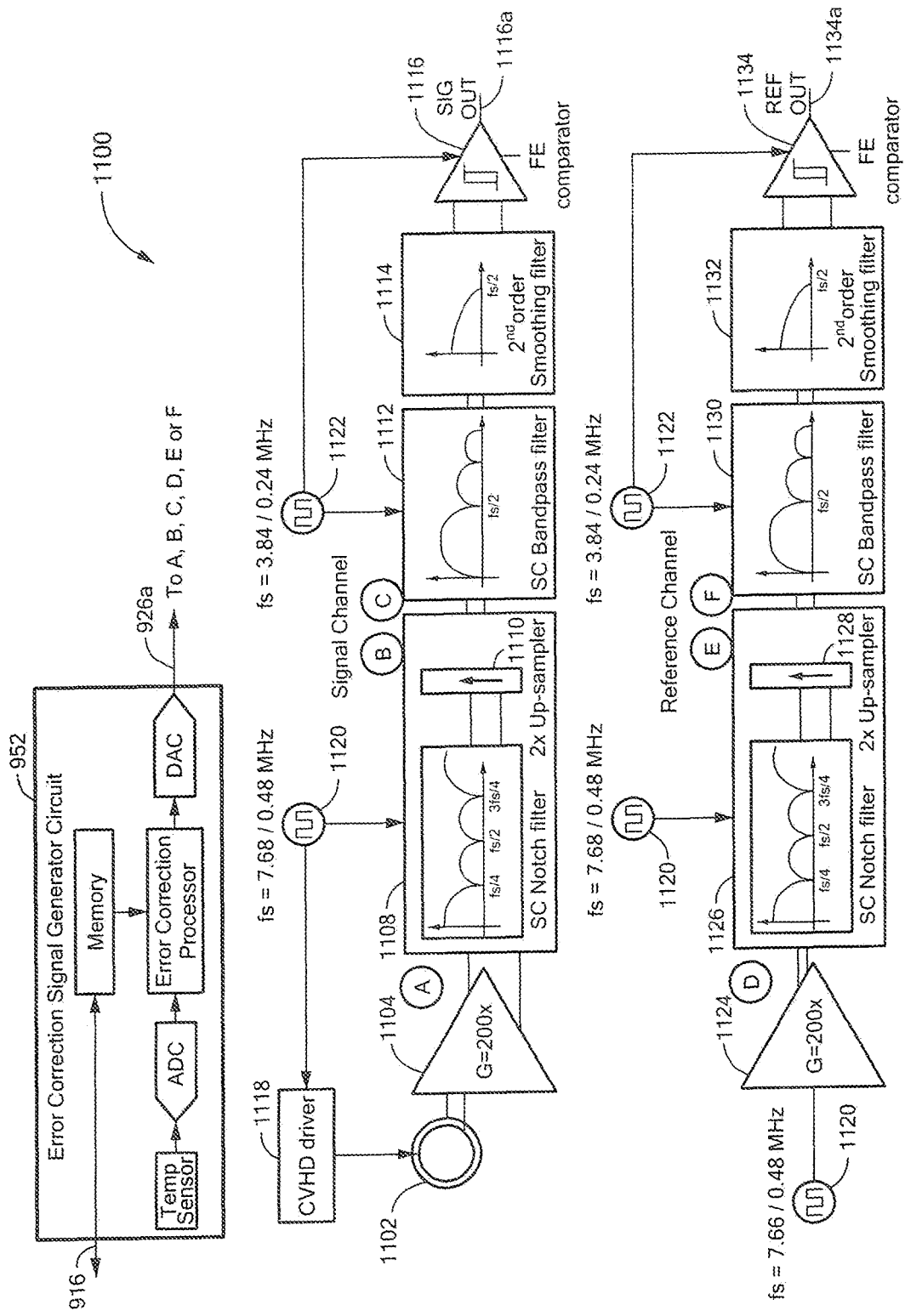
FIG. 11 is a block diagram showing a portion of another exemplary magnetic field sensor having another exemplary error correction signal generator circuit, the portion of the exemplary magnetic field sensor using sampled analog signals in two signal channels.

In FIG. 11 below is shown a two channel magnetic field sensor like the magnetic field sensor 300 of FIG. 3. However, while the magnetic field sensor 300 of FIG. 3 uses continuous analog circuitry, as described below in conjunction with FIG. 12, sampled analog circuitry can also be used.

Referring now to FIG. 11, a circuit portion 1100 of a magnetic field sensor can include a CVH sensing element 1102. While sequence switches and current spinning switches are not shown, either or both are represented instead as a CVHD driver 1118 coupled to the CVH sensing element 1102.

In a first signal channel, an amplifier 1104 can be coupled to receive a sequential signal from the CVH sensing element 1102 and configured to generate an amplified signal. A switched capacitor notch filter, with or without a 2× up-sampler, can be coupled to receive the amplified signal and configured to generate a first filtered sampled analog signal. The switched capacitor notch filter 1108 can be the same as or similar to the switched capacitor notch filter 610 described above in conjunction with FIG. 6.

The first filtered signal can be received by a switched capacitor bandpass filter 1112 configured to generate a second filtered sampled analog signal. A smoothing filter 1114, which can be a continuous analog filter, can be coupled to receive the second filtered sampled analog signal and configured to generate a first filtered continuous analog signal. A comparator 1116 can be coupled to receive the first filtered continuous analog signal and configured to generate a first comparison signal 1116a.

A second signal channel can be coupled to receive a clock signal from a clock generator 1120 at an amplifier 1124. A switched capacitor notch filter 1120, with or without a 2× up-sampler, a switched capacitor notch filter 1130, a smoothing filter 1132, and a comparator 1134 can be the same as or similar to such circuit elements described above in conjunction with the first signal channel. The second signal channel can generate a second comparison signal 1134a.

In some embodiments, the first and second comparison signals 1116a, 1134a, respectively, can be coupled to a counter and a latch, such as the counter 318 and the latch 320 described above in conjunction with FIG. 3, or alternatively, coupled to an angle calculation module, such as the angle calculation module 406 described above in conjunction with FIG. 4, each of which can generate an x-y angle signal representative of an angle of a magnetic field.

The circuit portion 1100 of the magnetic field sensor can also include the error correction signal generator circuit 952 described above in conjunction with FIG. 9, configured to generate the error correction signal 926a, a continuous analog signal.

The error correction signal, 926a, with amplitude and phase suitable for the connection point, can be coupled at a summing junction (not shown) at any one of the points labeled A-F. It will be appreciated that an error correction signal with an advance phase injected into the first signal channel at points labeled A-C is equivalent to an error correction signal with a retarded phase injected into the second signal channel at points labeled D-F, and vice versa.

Exemplary clock frequencies "fs" are associated with oscillators 1120 and 1122. Two clock frequencies are shown separated by a slash symbol "/", which are indicative of two modes of operation of the circuit portion 1100. A fast mode uses the higher frequency clock signal and can generate values of the output signals 1116a, 1134a at a high rate, ultimately resulting in a fast rate of updates to an x-y angle signal, similar to the x-y angle signal 406a of FIG. 4. A slow mode uses the slower clock signal and results in slower updates to the x-y angle signal, but with reduced power consumption.

Figure 12:
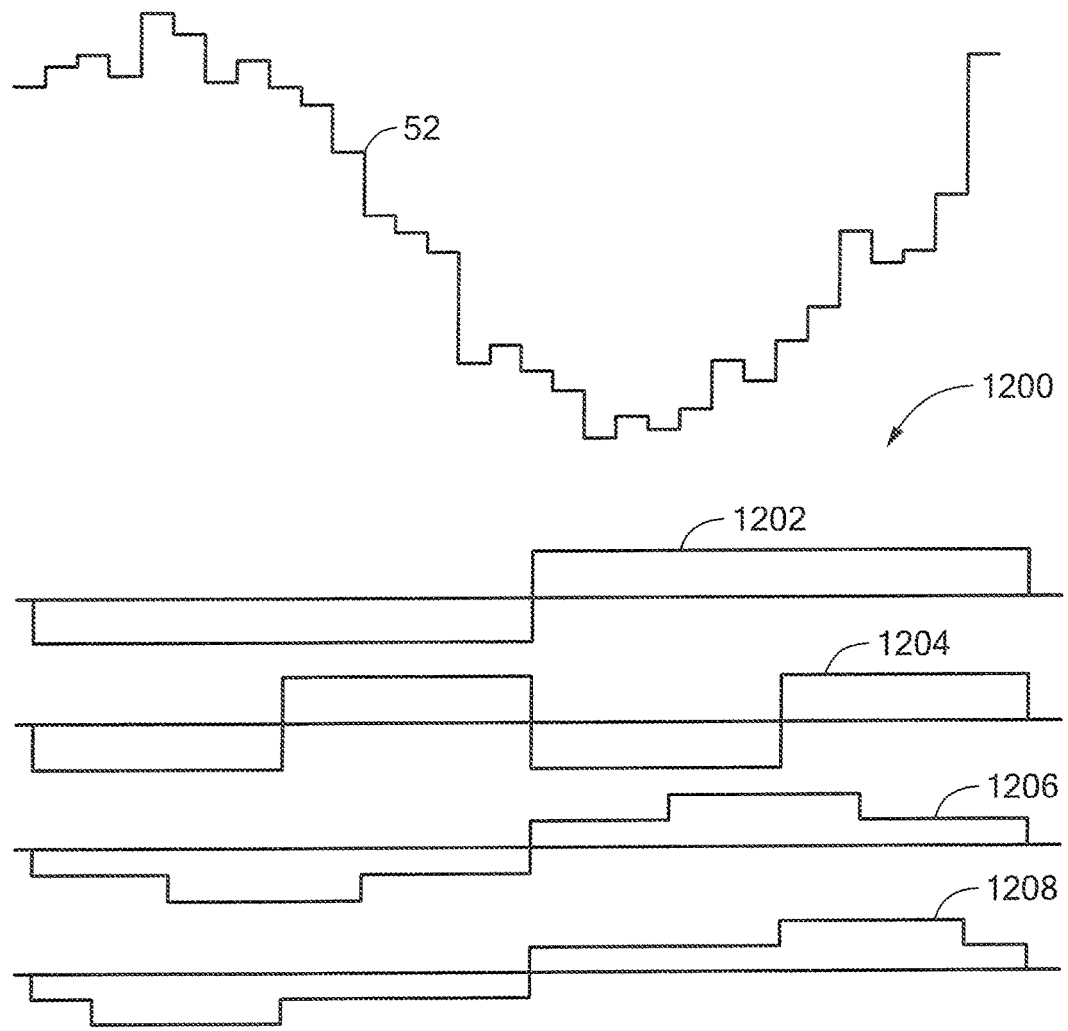
FIG. 12 is a set of graphs showing a sequential signal and various error correction signals that can be present in the portions of the magnetic field sensors of FIGS. 9, 10, and 11.

Referring now to FIG. 12, the sequential signal 52 of FIG. 2 is shown for reference. An error correction signal 1202 can be representative of either an analog or a digital error correction signal (see, e.g., error correction signals 926a, 1024a of FIGS. 9-11, respectively) at the fundamental frequency of the sequential signal 52. While the error correction signal 1202 is shown to be at a particular phase and amplitude relative to the signal 52, it should be understood that the error correction signal 1202 can have any phase and any amplitude suitable to cancel a fundamental frequency error component in the signal 52. The phase and amplitude can be selected by way of selected error correction coefficients 916a, 1017a of FIGS. 9-11.

It will be understood that the error correction signal 1202 has undesirable spectral content at odd harmonics of the fundamental frequency, which harmonics can be removed by the bandpass filters 912, 1014, 1112, 1130 described above in conjunction with FIGS. 9-11.

Another error correction signal 1204 can be representative of either an analog or a digital error correction signal at the second harmonic of the fundamental frequency of the sequential signal 52. While the error correction signal 1204 is shown to be at a particular phase and amplitude relative to the signal 52, it should be understood that the error correction signal 1204 can have any phase and any amplitude suitable to cancel a second harmonic error component in the signal 52. The phase and amplitude can be selected by way of selected error correction coefficients 916a, 1017a of FIGS. 9-11.

It will be understood that the error correction signal 1202 has undesirable spectral content at odd harmonics of the second harmonic frequency, which harmonics can be removed by the bandpass filters 912, 1014, 1112, 1130 described above in conjunction with FIGS. 9-11.

Another error correction signal 1206 can be representative of either an analog or a digital error correction signal as a sum of error correction signals at the fundamental frequency and at the second harmonic of the sequential signal 52, i.e. a sum of the error correction signals 1202, 1204, but each at a different phase and amplitude. While the error correction signal 1206 is shown to be at a particular fundamental frequency and second harmonic frequency phase and amplitude relative to the signal 52, it should be understood that the two components of the error correction signal 1206 can have any phase and any amplitude suitable to cancel a fundamental frequency error component in the signal 52. The phases and amplitudes can be selected by way of selected error correction coefficients 916a, 1017a of FIGS. 9-11.

It will be understood that the error correction signal 1206 has undesirable spectral content at various harmonics of the second harmonic frequency, which harmonics can be removed by the bandpass filters 912, 1014, 1112, 1130 described above in conjunction with FIGS. 9-11.

Another error correction signal 1208 can also be representative of either an analog or a digital error correction signal as a sum of error correction signals at the fundamental frequency and at the second harmonic of the sequential signal 52, but the fundamental frequency and the second harmonic frequency are at different phases and amplitudes than those represented by the error correction signal 1206. The phases and amplitudes can be selected by way of selected error correction coefficients 916a, 1017a of FIGS. 9-11.

It will be understood that the error correction signal 1208 has undesirable spectral content at various harmonics of the second harmonic frequency, which harmonics can be removed by the bandpass filters 912, 1014, 1112, 1130 described above in conjunction with FIGS. 9-11.

The selected phase amplitude of an error correction signal at the fundamental frequency of the signal 52, and the selected phase and amplitude of an error correction signal at the second harmonic of the fundamental frequency of the signal 52, whether used separately or combined together, can be determined in accordance with selected ones of the error correction coefficients described above, for example, the error correction coefficients 916a, 1017a of FIGS. 9-11, respectively, which can initially be provided from outside of the magnetic field sensor.

A variety of techniques can be used to identify error correction coefficients 914, 1015 of FIGS. 9 and 10, respectively, which are stored in respective memory devices 916, 1017. For example, magnetic field sensors having the circuit portions 900, 1000 can be exposed to a zero magnetic field when no error correction signals are used. If the sequential signals 904b, 1004b had no error components, i.e., if the sequential signal 52 of FIG. 2 exactly tracked the ideal sine wave 54, then the output signals 912a, 1014a would be expected to be zero. However, for reasons described above, due to the irregularity of the steps of the sequential signal 52, under these conditions, the output signals 912a, 1014a, are comprised of the above-described error components. The error components can include a fundamental frequency error component and any harmonic error components thereof, but primarily a fundamental frequency error component and a second harmonic error component, both of which pass through the bandpass filters 912, 1014 of FIGS. 9 and 10, respectively. Thus, under these conditions, phases and amplitudes of the error components can be measured, for example, with production test equipment. The error correction coefficients 914, 1015 stored in the magnetic field sensors 900, 1000 can thus be determined. Here correction coefficients can be an amplitude and phase of the fundamental frequency of the error correction signals 926a, 1024a, and of any number of harmonic components thereof.

In some arrangements, the above measurement can be taken at a variety of predetermined temperatures. In these arrangements, amplitude and phase correction coefficients for the fundamental frequency of the error correction signals and any harmonic components thereof can be determined at each one of the variety of predetermined temperatures. Thus, the memory devices 916, 1017 can store amplitude and phase correction coefficients for the fundamental frequency of the error correction signals in any harmonic components thereof at a variety of different temperatures.

Circuits portions shown above in conjunction with FIGS. 9-11 advantageously inject (e.g., sum) an error correction signal into a signal channel before a bandpass filter. With these arrangements, the error correction signal can be simple and can have harmonic content, which harmonic content of the error correction signal can be removed by the bandpass filter. In contrast, some embodiments of circuits shown below in conjunction with FIGS. 13-15 inject error correction signals after the bandpass filter and these employ a slightly more complex error correction signal with smaller harmonic content.

Figure 13:
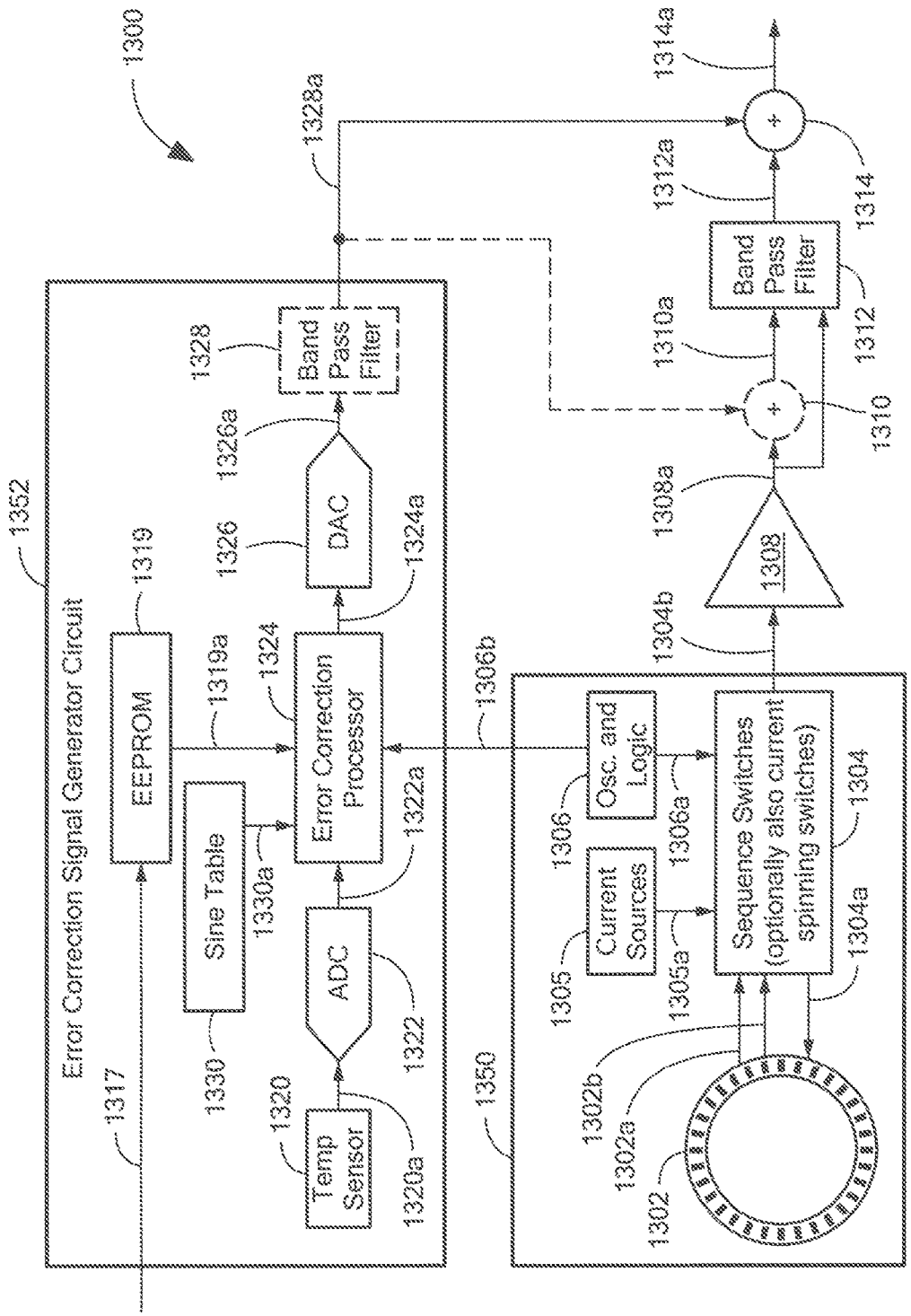
FIG. 13 is a block diagram showing a portion of another exemplary magnetic field sensor having another exemplary error correction signal generator circuit, the portion of the exemplary magnetic field sensor using analog signals in one signal channel.

Referring now to FIG. 13, a circuit portion 1300 of a magnetic field sensor can include a sensing circuit, which can be the same as or similar to the sensing circuit 950 of FIG. 9. The sensing circuit 1350 can include a CVH sensing element 1302, a sequence switches circuit 1304, optionally with current spinning switches, an oscillator and logic circuit 1306, and one or more current sources 1305, which can be the same as or similar to similar elements 902, 904, 906, 905 of FIG. 9.

An amplifier 1308 can be coupled to receive a sequential analog signal 1304b from the sequence switches circuit 1304 and configured to generate an amplified signal 1308a, also a sequential signal. A bandpass filter 1312 can be coupled to receive the amplified signal 1308a and configured to generate a filtered signal 1312a. In a first embodiment, a summing node 1314 can be coupled to receive the filtered signal 1312a and can figure to generate a summed signal 1314a.

In alternate embodiments, the summing node 1314 can be replaced by a summing node 1310 coupled to receive the amplified signal 1308a and configured to generate a summed signal 1310a received by the bandpass filter 1312.

It will be understood from FIGS. 3 and 4, that, in some embodiments, the summed signal 1014a can be received by an angle calculation module (not shown), for example, the angle calculation module 406 of FIG. 4, in order to generate an x-y angle signal representative of an angle of a magnetic field sensed by the CVH sensing element 1002 in an x-y plane.

The circuit portion 1300 of the magnetic field sensor can also include an error correction signal generator circuit 1352. The error correction signal generator circuit 1352 can be similar to the error correction signal generator circuit 952 of FIG. 9. However, the error correction signal generator circuit 1352 includes a sine table 1330, and also optionally includes a bandpass filter 1326 used in the above-described first embodiment, where the summing node 1314 is used.

The error correction signal generator circuit 1352 is configured to generate an error correction signal 1328a. The summing node 1314 (or 1310) is coupled to receive the error correction signal 1328a at a second input node.

From discussion above in conjunction with FIG. 5, it will be understood that the sequential signal 1304b and the amplified signal 1308a both include a variety of signal components, including, a desired signal component at a fundamental frequency of the sequential signal. 52 of FIG. 2, an error component at the fundamental frequency, and further error components at harmonics, e.g., a second harmonic, of the fundamental frequency. At least the error component at the fundamental frequency and some amount of error component at the second harmonic of the fundamental frequency appears in the filtered signal 1312a for embodiments that use the summing node 1314. These error components can ultimately result in an error of the angle of the magnetic field reported by the x-y angle signal 320, 406 of FIGS. 3 and 4. In essence, the error correction signal 1328a cancels error components that would otherwise be in the filtered signal 1312a.

The error correction signal generator circuit 1352 can include a memory device 1319, which, in some embodiments, can be in nonvolatile memory device, for example an EEPROM or a PROM, coupled to receive one or more error correction coefficients 1317 from outside of the portion 1300. The error correction coefficients are described more fully above.

The error correction signal generator circuit 1352 can include an error correction processor 1324. The error correction processor 1324 can be coupled to receive selected error correction coefficients 1319a and configured to generate a digital error correction signal 1324a. A DAC (digital to analog converter) 1326 can convert the digital error correction signal 1324a into an analog error correction signal 1326a. A bandpass filter 1328 (or optionally, a low pass filter), can be coupled to receive the analog error correction signal 1326a and configured to generate the error correction signal 1328a as a filtered analog error correction signal 1328a.

In some embodiments, the error correction signal generator circuit 1352 can include a temperature sensor 1320 configured to generate a temperature signal 1320a. An ADC (analog-to-digital converter) 1322 can be coupled to receive the temperature signal 1320a and configured to generate a digital temperature signal 1322a received by the error correction processor 1324. In some embodiments, the error correction processor 1324 generates the analog error correction signal 1326a in accordance with the selected error correction coefficients 1319a. In other embodiments, the error correction processor 1324 generates the analog error correction signal 1326a in accordance with the temperature signal 1320a and in accordance with the selected error correction coefficients 1319a. In other words, in some embodiments, the error correction processor 1324 can either modify the selected error correction coefficients 1319a, or, the error correction processor 1324 can make the selection of the selected error correction coefficients 1319a in accordance with the temperature signal 1320a.

In view of the above, in some embodiments, the error correction signal generator circuit 1352 generates the analog error correction signal 1326a without regard to temperature. In other embodiments, the error correction signal generator circuit 1352 generates the analog error correction signal 1326a to account for changes that may occur in the error components of the amplified signal 1308a as temperature changes.

In some embodiments, the error correction processor 1324 can also generate the analog error correction signal 1326a in accordance with sine values 1330a stored in the sine lookup table 1330.

In essence, in some embodiments that use the sine table 1330, the error correction signal generator circuit 1352 can generate the analog error correction signal 1326a to have less harmonic content than the error correction signals described above in conjunction with FIG. 12. In other words, the analog error correction signal 1326a can have more steps, selected in accordance with the sine values 1330a, and steps with lower amplitude changes from step to step than the signals described above in conjunction with FIG. 12. These error correction signals are more fully described below in conjunction with FIG. 15.

However, it should be recognized that, in some alternate embodiments, the error correction signal generator circuit 1352 can use the same types of error correction signals as those described above in conjunction with FIG. 12, i.e., having only a few states, as the analog error correction signal 1326a, with or without the sine lookup table 1330, and, unlike the circuit portions 900, 1000 of FIGS. 9 and 10, can inject the error correction signal 1328a into the summing node 1314 after the bandpass filter 1312, because the error correction signal generator circuit 1352 can include its own (i.e., a second) bandpass filter 1328 to remove unwanted spectral content from the analog error correction signal 1326a.

As described above, it will be understood from FIGS. 3 and 4, that, in some embodiments, the summed signal 1312a can be received by an angle calculation module (not shown), for example, the angle calculation module 406 of FIG. 4, in order to generate an x-y angle signal representative of an angle of a magnetic field sensed by the CVH sensing element 1302 in an x-y plane. The bandpass filter 1328 is necessary to avoid steps in the summed signal 1312a that would be interpreted by a following angle calculation module to be steps (i.e., coarse granularity) in the calculated direction of the magnetic field.

In some alternate embodiments for which the summing node 1310 is instead used, the bandpass filter 1328 is not needed and the error correction signal generator circuit 1352 can use the sine table 1330 or not.

In other embodiments, the CVH sensing element 902 can be replaced by a plurality of separate magnetic field sensing elements, such as those described above in conjunction with FIG. 1A.

Importantly, because the summing node 1314 is connected at the output of the bandpass filter 1312, the error correction signal 1328a must be smooth in nature, which is easiest to achieve if the analog error correction signal 1326a has many analog states with small amplitude transitions. For example, in one embodiment, the analog error correction signal 1326a can have quantity of analog states equal to a quantity of states in the sequential signal 1304b, e.g., sixty-four sequential states, and with a fundamental frequency at the fundamental frequency of the sequential signal 1304ba. An amplitude and a phase of such an analog error correction signal 1326a can be selected by way of the error correction coefficients 1319a to cancel the fundamental frequency error component of the amplified signal 1308a described above.

It should be understood that, in some embodiments, the various magnetic field sensors, including the various CVH sensing elements above, can each be formed on a respective common substrate.

While the error correction signal generator circuit 1352 is shown to generate the error correction signal 1328a, which can be smooth in nature, other types of circuits can generate the error correction signal 1328a having the smooth characteristic. For example, a function generator circuit (e.g., part number AD639 by Analog Devices) can be used to generate a sinusoidal signal with a desired amplitude and phase. In some embodiments, such a function generator circuit can be formed on a common substrate with other elements of the circuit portion 1300.

Figure 14:
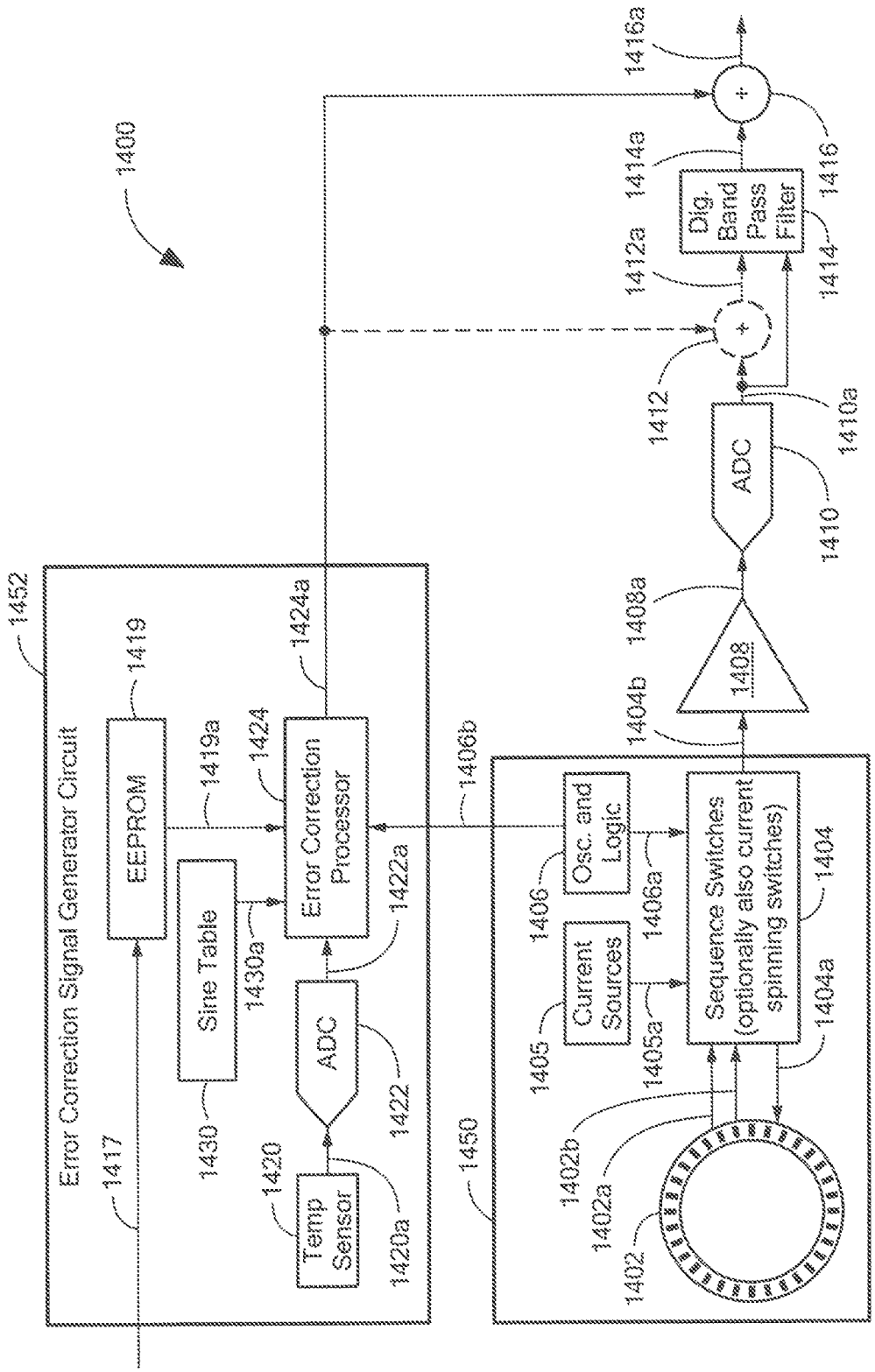
FIG. 14 is a block diagram showing a portion of another exemplary magnetic field sensor having another exemplary error correction signal generator circuit, the portion of the exemplary magnetic field sensor using digital signals in one signal channel.

Referring now to FIG. 14, a circuit portion 1400 of another magnetic field sensor is similar to the circuit portion 1300 of the magnetic field sensor of FIG. 13, however, the circuit portion 1400 operates more in the digital domain. Accordingly, the circuit portion 1400 includes an ADC 1410 configured to generate a converted signal 1410a. In some embodiments, a digital bandpass filter 1414 is coupled to receive the converted signal 1410a and configured to generate a digital filtered signal 1414a. A digital summing node 1416 can be coupled to receive the digital filtered signal 1414a and configured to generate a digital summed signal 1416a.

In some alternate embodiments, the summing node 1416 is replaced by a summing node 1412 coupled to receive the converted signal 1410a and configured to generate a summed signal 1412 received by the digital bandpass filter 1414.

The circuit portion 1400 can include an error correction signal generator circuit 1452, which can be similar to the error correction signal generator circuit 1352 of FIG. 13. Here however, the DAC 1326 and the bandpass filter 1328 of FIG. 13 are not needed. The error correction signal generator circuit 1452 is configured to generate a digital error correction signal 1424a having a sufficient number of digital steps to be the same as or equal to the number of digital steps in the digital filtered signal 1414a, or optionally, in the converted signal 1410a. Thus, the error correction signal 1424a can be easily summed in the digital domain with either signal.

Further details of the operation of the circuit portion 1400 will be apparent from discussion above in conjunction with other figures. Thus no further discussion of the operation of the portion 1400 is presented here.

While various summing nodes are described above in conjunction with FIGS. 9-11, 13, and 14, the summing nodes can be replaced with arithmetic logic units operable to combine the amplified signals with the error correction signals. In some embodiments, the arithmetic logic units are operable to identify a magnitude of the sensed magnetic field by way of the amplified signals and operable to combine the amplified signals with the error correction signals with adjustments according to the identified magnitude.

Above circuit nodes carrying the signals 912a, 1014a, 116a, 1134a, 1314a (or, in optional embodiments, 1312a), and 1416a (or, in optional embodiments, 1414a) are referred to herein as angle processing channel output nodes.

Figure 15:
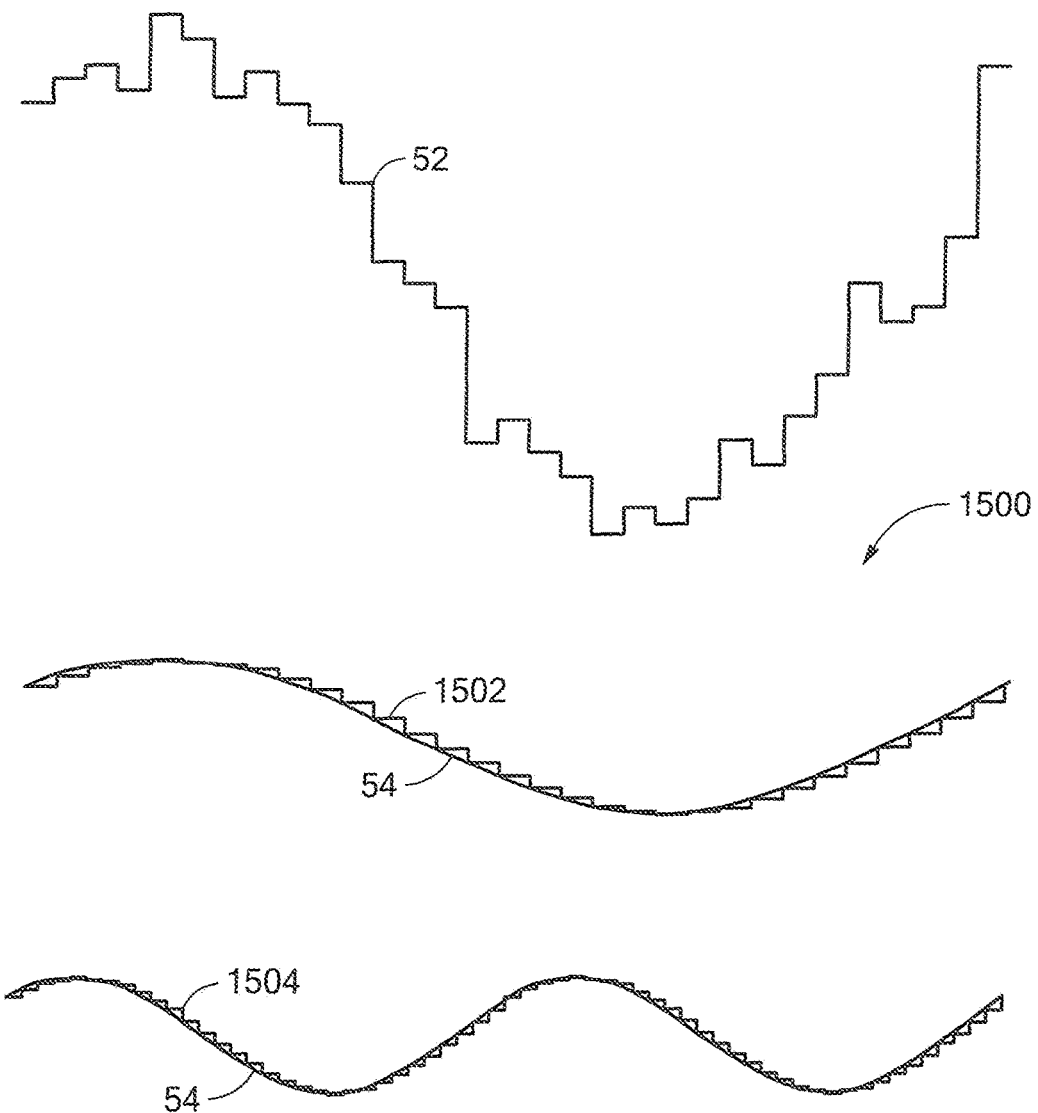
FIG. 15 is a set of graphs showing a sequential signal and various error correction signals that can be present in the portions of the magnetic field sensors of FIGS. 13 and 14.

Referring now to FIG. 15, the sequential signal 52 of FIG. 2 is shown for reference. For embodiments of FIGS. 13 and 14 that use the sine tables 1330, 1430, respectively, and thus have many steps of the resulting digital error correction signals 1324a, 1424a, an error correction signal 1502 can be representative of either an analog or a digital error correction signal (see, e.g., error correction signals 1324a, 1326a, 1424a of FIGS. 13 and 14, respectively) at the fundamental frequency of the sequential signal 52. While the error correction signal 1502 is shown to be at a particular phase and amplitude relative to the signal 52, it should be understood that the error correction signal 1502 can have any phase and any amplitude suitable to cancel a fundamental frequency error component in the signal 52, the phase and amplitude determined in accordance with stored phase and amplitude correction coefficients.

It will be understood that the error correction signal 1502 has undesirable spectral content, which content can be removed by the bandpass filter 1328 of FIG. 13, or not removed in the circuit portion 1400 of FIG. 14, but later removed by a subsequent smoothing filter (not shown).

Another error correction signal 1504 can be representative of either an analog or a digital error correction signal at the second harmonic of the fundamental frequency of the sequential signal 52. While the error correction signal 1504 is shown to be at a particular phase and amplitude relative to the signal 52, it should be understood that the error correction signal 1504 can have any phase and any amplitude suitable to cancel a second harmonic error component in the signal 52, the phase and amplitude determined in accordance with stored phase and amplitude correction coefficients.

It will be understood that the error correction signal 1502 has undesirable spectral content, which content can be removed by the bandpass filter 1328 of FIG. 13, or not removed in the portion 1400 of FIG. 14, but later removed by a subsequent smoothing filter.

A sum of the error correction signals 1502, 1504 can be used for embodiments in which cancellation of both a fundamental frequency error component and a second harmonic error component of the sequential signal 52 is desired. A sum of the error correction signals 1502, 1504 is not shown but will be understood.

It should be apparent that, with the techniques described above, a fundamental frequency error component of the sequential signal 52, and/or any combination of harmonics thereof can be reduced or eliminated by way of injecting an error correction signal into a signal path, wherein the error correction signal tends to cancel the error components of the sequential signal 52.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:
1. A magnetic field sensor, comprising:
a plurality of magnetic field sensing elements configured to generate a respective plurality of x-y output signals, wherein each one of the x-y output signals is responsive to a magnetic field in an x-y plane;
a sequence switches circuit coupled to receive the plurality of x-y output signals and configured to generate a sequential signal comprised of sequential ones of the plurality of x-y output signals, wherein the sequential signal comprises a time waveform comprising a respective fundamental frequency component and an error component;
an angle calculation module having an input node and an output node, wherein the angle calculation module is configured to generate an x-y angle value at the output node of the angle calculation module that is indicative of an angle of the magnetic field in an x-y plane;
an angle processing channel coupled between the sequence switches circuit and the angle calculation module, wherein the angle processing channel comprises:
an electronic filter having an input node and an output node, wherein the electronic filter is configured to generate a filtered signal at the output node of the electronic filter; and
a summing circuit having first and second input nodes and an output node, wherein either:
the first input node of the summing circuit is coupled to the sequential signal, the output node of the summing circuit is coupled to the input node of the electronic filter, and the output node of the elec- tronic filter is coupled to the input node of the angle calculation module, or the input node of the filter is coupled to the sequential signal, the first input node of the summing circuit is coupled to the filtered signal, and the output node of the summing circuit is coupled to the input node of the angle calculation module, wherein the magnetic field sensor further comprises:

an error correction signal generator circuit having an output node, the error correction signal generator circuit for generating an error correction signal at the output node of the error correction signal generator, wherein the output node of the error correction signal generator circuit is coupled to the second input node of the summing circuit, wherein the summing circuit is configured to generate a signal at the output node of the summing circuit with a corrected error component smaller than the error component of the sequential signal; and a sine look up table memory coupled to the error correction processor and configured to store a plurality of sine values, wherein the error correction signal is generated by selecting sequential ones of the plurality of sine values, wherein the error correction signal comprises a respective frequency component having a frequency equal to an integer multiple of the fundamental frequency component of the sequential signal.

2. The magnetic field sensor of claim 1, wherein the error correction signal generator circuit comprises:

an error correction processor; and a non-volatile coefficient table memory coupled to the error correction processor and configured to store a plurality of correction coefficients, wherein the error correction processor is configured to generate the error correction signal in accordance with selected ones of the stored plurality of correction coefficients and in accordance with selected ones of the sine values.

3. The magnetic field sensor of claim 2, wherein the error correction signal generator circuit further comprises:

a temperature sensor coupled to the error correction processor and configured to generate a temperature signal, wherein the error correction processor is configured to generate the error correction signal in accordance with selected ones of the stored plurality of correction coefficients, in accordance with selected ones of the sine values, and in accordance with the temperature signal.

4. The magnetic field sensor of claim 2, wherein the plurality of magnetic field sensing elements comprises a plurality of vertical Hall Effect elements arranged as a circular vertical Hall (CVH) element, wherein each one of the plurality of vertical Hall Effect elements is arranged upon a common circular implant and diffusion region in a first major surface of a semiconductor substrate, wherein the plurality of vertical Hall Effect elements is configured to generate a respective plurality of x-y output signals responsive to a magnetic field having a direction component in an x-y plane parallel to the first surface of the semiconductor substrate, the x-y plane having an x-direction and a y-direction orthogonal to the x-direction, wherein the plurality of x-y output signals is generated in a plurality of cycle periods, each cycle period corresponding to one cycle around the CVH sensing element, the cycle periods occurring at a cycle rate.

5. The magnetic field sensor of claim 2, wherein the error component has a respective fundamental frequency component, and wherein the error correction signal comprises an error correction signal fundamental frequency component having the same frequency as the fundamental frequency component of the error component.

6. The magnetic field sensor of claim 5, wherein the error correction signal fundamental frequency component has an amplitude and a phase selected to reduce the fundamental frequency component of the error component.

7. The magnetic field sensor of claim 6, wherein the error correction processor comprises a digital filter configured to generate a multi-state digital signal, wherein the error correction signal fundamental frequency component results from the multi-state digital signal.

8. The magnetic field sensor of claim 6, wherein the error correction signal fundamental frequency component results from a multi-state signal.

9. The magnetic field sensor of claim 2, wherein the error component has a respective fundamental frequency component and a second harmonic frequency component, and Wherein the error correction signal comprises an error correction signal first fundamental frequency component having the same frequency as the fundamental frequency component of the error component, and an error correction signal second fundamental frequency component having the same frequency as the second harmonic frequency component of the error component.

10. The magnetic field sensor of claim 9, wherein the error correction signal first and second fundamental frequency components have respective amplitudes and respective phases selected to reduce the fundamental frequency component and the second harmonic frequency component of the error component.

11. The magnetic field sensor of claim 10, wherein the error correction processor comprises a digital filter configured to generate a multi-state digital signal, wherein the error correction signal first fundamental frequency and the error correction signal second fundamental frequency component result from the multi-state digital signal.

12. The magnetic field sensor of claim 10, wherein the error correction signal first fundamental frequency component results from a first multi-state signal and the error correction signal second fundamental frequency component results from a second different multi-state signal.

13. A method of reducing an error in a magnetic field sensor, comprising:

providing a plurality of magnetic field sensing elements configured to generate a respective plurality of x-y output signals, wherein each one of the x-y output signals is responsive to a magnetic field in an x-y plane;

using the plurality of x-y output signals to generate a sequential signal comprised of sequential ones of the plurality of x-y output signals, wherein the sequential signal comprises a time waveform comprising a respective fundamental frequency component and an error component;

filtering a signal representative of the sequential signal to generate a filtered signal;

generating an error correction signal;

summing the error correction signal with the signal representative of the sequential signal or with the filtered signal to generate a summed signal with a corrected error component smaller than the error component of the sequential signal; and storing a plurality of sine values, wherein the error correction signal is generated by selecting sequential ones of the plurality of sine values, wherein the error correction signal comprises a respective frequency component having a frequency equal to an integer multiple of the fundamental frequency component of the sequential signal.

14. The method of claim 13, further comprising:
generating an x-y angle value representative of an angle of the magnetic field in an x-y plane.

15. The method of claim 13, wherein the generating the error correction signal comprises:
storing a plurality of correction coefficients in a non-volatile coefficient table memory;
generating the error correction signal in accordance with selected ones of the stored plurality of correction coefficients and in accordance with selected ones of the sine values.

16. The method of claim 15, wherein the generating the error correction signal further comprises:
generating a temperature signal; and
generating the error correction signal in accordance with selected ones of the stored plurality of correction coefficients, in accordance with selected ones of the sine values, and in accordance with the temperature signal.

17. The method of claim 15, wherein the plurality of magnetic field sensing elements comprises a plurality of vertical Hall Effect elements arranged as a circular vertical Hall (CVH) element, wherein each one of the plurality of vertical Hall Effect elements is arranged upon a common circular implant and diffusion region in a first major surface of a semiconductor substrate, wherein the plurality of vertical Hall Effect elements is configured to generate a respective plurality of x-y output signals responsive to a magnetic field having a direction component in an x-y plane parallel to the first surface of the semiconductor substrate, the x-y plane having an x-direction and a y-direction orthogonal to the x-direction, wherein the plurality of x-y output signals is generated in a plurality of cycle periods, each cycle period corresponding to one cycle around the CVH sensing element, the cycle periods occurring at a cycle rate.

18. The method of claim 15, wherein the error component has a respective fundamental frequency component, and wherein the error correction signal comprises an error correction signal fundamental frequency component having the same frequency as the fundamental frequency component of the error component.

19. The method of claim 18, wherein the error correction signal fundamental frequency component has an amplitude and a phase selected to reduce the fundamental frequency component of the error component.

20. The method of claim 19, wherein the error correction signal fundamental frequency component results from a multi-state digital signal.

21. The method of claim 19, wherein the error correction signal fundamental frequency component results from a multi-state signal.

22. The method of claim 15, wherein the error component has a respective fundamental frequency component and a second harmonic frequency component, and wherein the error correction signal comprises an error correction signal first fundamental frequency component having the same frequency as the fundamental frequency component of the error component and an error correction signal second fundamental frequency component having the same frequency as the second harmonic frequency component of the error component.

23. The method of claim 22, wherein the error correction signal first and second fundamental frequency components have respective amplitudes and respective phases selected to reduce the fundamental frequency component and the second harmonic frequency component of the error component.

24. The method of claim 23, wherein the error correction signal first fundamental frequency component results from a first multi-state digital signal and the error correction signal second fundamental frequency component results from the first multi-state digital signal.

25. The method of claim 23, wherein the error correction signal first fundamental frequency component results from a first multi-state digital signal and the error correction signal second fundamental frequency component results from a second different multi-state digital signal.

26. The magnetic field sensor of claim 1, further comprising a substrate having a surface oriented in the x-y plane, wherein the plurality of magnetic field sensing element are disposed upon the surface of the substrate, wherein at least two of the plurality of magnetic field sensing elements have maximum response axes that are in different directions in the x-y plane.

27. The method of claim 1, wherein the providing the plurality of magnetic field sensing elements comprises forming the plurality of magnetic field sensing elements upon a surface of a substrate, the surface of the substrate oriented in the x-y plane, wherein at least two of the plurality of magnetic field sensing elements have maximum response axes that are in different directions in the x-y plane.

* * * * *

UNITED STATES PATENT AND TRADEMARK OFFICE
CERTIFICATE OF CORRECTION

PATENT NO. : 10,120,042 B2
APPLICATION NO. : 14/138840
DATED : November 6, 2018
INVENTOR(S) : Aurelian Diaconu et al.

Page 1 of 4

It is certified that error appears in the above-identified patent and that said Letters Patent is hereby corrected as shown below:

On the Title Page

Item (71), delete "Allegro Microsystems, LLC, Worcester, MA (US)" and replace with --Allegro Microsystems, LLC, Manchester, NH, (US)--.

In the Specification

Column 1, Line 34, delete "to magnetic" and replace with --to a magnetic--.

Column 1, Line 37, delete "to magnetic" and replace with --to a magnetic--.

Column 2, Line 18, delete "herein "angle" and replace with --herein as an "angle"--.

Column 2, Lines 19-20, delete "of and angle" and replace with --of an angle--.

Column 2, Line 24, delete "or and angular" and replace with --or an angular--.

Column 2, Line 32, delete "It is know" and replace with --It is known--.

Column 6, Line 40, delete "substrate 34" and replace with --substrate--.

Column 8, Line 46, delete "signal 308$b$" and replace with --signal 308$a$--.

Column 8, Line 51, delete "52 of FIG. 3," and replace with --52 of FIG. 2,--.

Column 8, Line 59, delete "308$a$, 308$b$" and replace with --306$a$, 306$b$--.

Column 8, Line 64, delete "308$a$, 308$b$." and replace with --306$a$, 306$b$.--.

Signed and Sealed this
Sixteenth Day of April, 2019

Andrei Iancu
*Director of the United States Patent and Trademark Office*

CERTIFICATE OF CORRECTION (continued)
U.S. Pat. No. 10,120,042 B2

Column 8, Line 65, delete "308*a*, 308*b*" and replace with --306*a*, 306*b*--.

Column 9, Line 8, delete "308*a*, 308*b*" and replace with --306*a*, 306*b*--.

Column 9, Line 10, delete "308*a*, 308*b*" and replace with --306*a*, 306*b*--.

Column 9, Line 16, delete "can be by" and replace with --can be--.

Column 10, Line 46, delete "angle calculation module 408" and replace with --angle calculation module 406--.

Column 10, Line 48, delete "angle calculation module 408" and replace with --angle calculation module 406--.

Column 11, Line 18, delete "of the an x-y angle" and replace with --of an x-y angle--.

Column 11, Line 36, delete "switches 304 major" and replace with --switches 304 and/or--.

Column 12, Line 5, delete "(NH sensing element." and replace with --CVH sensing element.--.

Column 12, Line 19, delete "a variety factors" and replace with --a variety of factors--.

Column 12, Line 22, delete "experience by the" and replace with --experienced by the--.

Column 12, Line 29, delete "experience by the" and replace with --experienced by the--.

Column 13, Line 55, delete "606*a*, 606*b*" and replace with --608*a*, 608*b*--.

Column 14, Line 3, delete "608*a*, 608*c*" and replace with --608*a*, 608*b*--.

Column 14, Line 27, delete "to a. DC" and replace with --to a DC--.

Column 14, Line 33, delete "of one of particular" and replace with --of one particular--.

Column 14, Line 40, delete "610*a*, 610*h*" and replace with --610*a*, 610*b*--.

Column 15, Lines 16-17, delete "sequence switches 902" and replace with --sequence switches 904--.

Column 15, Line 20, delete "sequence switches 902" and replace with --sequence switches 904--.

Column 16, Line 6, delete "be in nonvolatile memory" and replace with --be a nonvolatile memory--.

Column 16, Line 27, delete "signal. 926*a*" and replace with --signal 926*a*--.

Column 17, Line 1, delete "In some another" and replace with --In some other--.

CERTIFICATE OF CORRECTION (continued)
U.S. Pat. No. 10,120,042 B2

Column 17, Line 5, delete "and a phases" and replace with --and phases--.

Column 17, Line 6, delete "an second" and replace with --and second--.

Column 17, Line 15, delete "states.\" and replace with --states.--.

Column 17, Line 36, delete "1010," and replace with --1010$a$,--.

Column 18, Line 3, delete "be in nonvolatile" and replace with --be a nonvolatile--.

Column 18, Line 22, delete "coefficients 1016$a$." and replace with --coefficients 1017$a$.--.

Column 18, Lines 25-26, delete "coefficients 1016$a$." and replace with --coefficients 1017$a$.--.

Column 18, Line 28, delete "coefficients 1016$a$," and replace with --coefficients 1017$a$,--.

Column 18, Line 30, delete "coefficients 1016$a$" and replace with --coefficients 1017$a$--.

Column 18, Line 63, delete "In some another" and replace with --In some other--.

Column 18, Line 66, delete "1014$b$" and replace with --1014$a$--.

Column 19, Line 7, delete "1012$a$." and replace with --1012.--.

Column 19, Line 54, delete "notch filter 1120," and replace with --notch filter 1126--.

Column 22, Line 32, delete "can figure to" and replace with --configured to--.

Column 22, Line 39, delete "summed signal 1014$a$" and replace with --summed signal 1314$a$--.

Column 22, Line 43, delete "CVH sensing element 1002" and replace with --CVH sensing element 1302--.

Column 22, Line 51, delete "bandpass filter 1326" and replace with --bandpass filter 1328--.

Column 23, Line 9, delete "be in nonvolatile" and replace with --be a nonvolatile--.

Column 24, Line 29, delete "CVH sensing element 902" and replace with --CVH sensing element 1302--.

Column 24, Line 39, delete "can have quantity" and replace with --can have a quantity--.

Column 24, Lines 42-43, delete "sequential signal 1304$ba$." and replace with --sequential signal 1304$b$.--.

Column 25, Line 10, delete "summed signal 1412" and replace with --summed signal 1412$a$--.

Column 25, Line 38, delete "116*a*" and replace with --1116*a*--.

Column 26, Line 31, delete "that that scope" and replace with --that the scope--.

Column 28, Lines 19-20, delete "and Wherein" and replace with --and wherein--.

In the Claims

Column 30, Line 36, delete "element are" and replace with --elements is--.